US009903928B2

(12) United States Patent
Snyder et al.

(10) Patent No.: US 9,903,928 B2
(45) Date of Patent: Feb. 27, 2018

(54) BEAM STEERING WITH RESONANCE ALONG A TRAJECTORY

(71) Applicant: Regents of the University of Minnesota, Minneapolis, MN (US)

(72) Inventors: Angela Lynn Styczynski Snyder, Minneapolis, MN (US); Carl J. Snyder, Minneapolis, MN (US); Michael G. Garwood, Medina, MN (US); J. Thomas Vaughan, Jr., Stillwater, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 706 days.

(21) Appl. No.: 14/174,368

(22) Filed: Feb. 6, 2014

(65) Prior Publication Data

US 2014/0218028 A1    Aug. 7, 2014

Related U.S. Application Data

(60) Provisional application No. 61/761,470, filed on Feb. 6, 2013.

(51) Int. Cl.
*G01V 3/00*     (2006.01)
*G01R 33/48*    (2006.01)
*G01R 33/483*   (2006.01)
*G01R 33/565*   (2006.01)

(52) U.S. Cl.
CPC ..... *G01R 33/4816* (2013.01); *G01R 33/4833* (2013.01); *G01R 33/5659* (2013.01); *G01R 33/56536* (2013.01); *G01R 33/56563* (2013.01)

(58) Field of Classification Search
CPC ............ G01R 33/5608; G01R 33/4828; G01R 33/4835; A61B 5/055
USPC ......................................................... 324/309
See application file for complete search history.

(56) References Cited

U.S. PATENT DOCUMENTS

| 6,144,873 A * | 11/2000 | Madore ............... G01R 33/561 324/309 |
| 2004/0122323 A1* | 6/2004 | Vortman .................. A61N 7/02 600/459 |
| 2004/0260173 A1* | 12/2004 | Salerno .............. G01R 33/5601 600/420 |
| 2005/0017717 A1* | 1/2005 | Duerk .............. G01R 33/56563 324/307 |
| 2006/0119623 A1* | 6/2006 | Quigley ............... A61B 5/0263 345/653 |
| 2008/0129298 A1* | 6/2008 | Vaughan .............. G01R 33/583 324/322 |
| 2009/0267604 A1* | 10/2009 | Umeda .............. G01R 33/4828 324/309 |

(Continued)

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

A method for generating a magnetic resonance image includes configuring a magnetic field to correspond to a trajectory within a region of interest. The method includes applying RF excitation to spatially control a region of magnetic resonance corresponding to the trajectory. The method includes modulating the magnetic field coincident with the spatially controlled region of magnetic resonance. The method includes acquiring data corresponding to the region of magnetic resonance and generating an image based on the data.

14 Claims, 18 Drawing Sheets

(56) References Cited

U.S. PATENT DOCUMENTS

2012/0112745 A1\* 5/2012 Takizawa ............ G01R 33/4824
324/309
2013/0271133 A1\* 10/2013 Snyder .................... G01R 33/56
324/309

\* cited by examiner

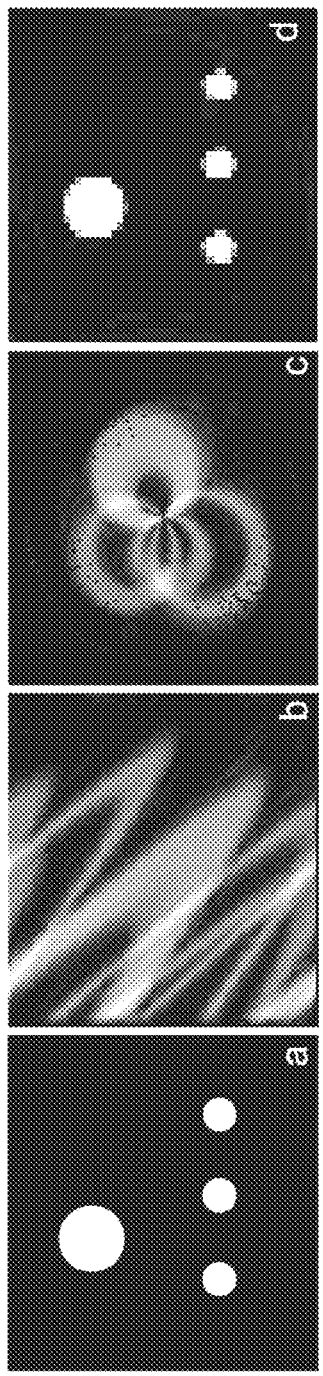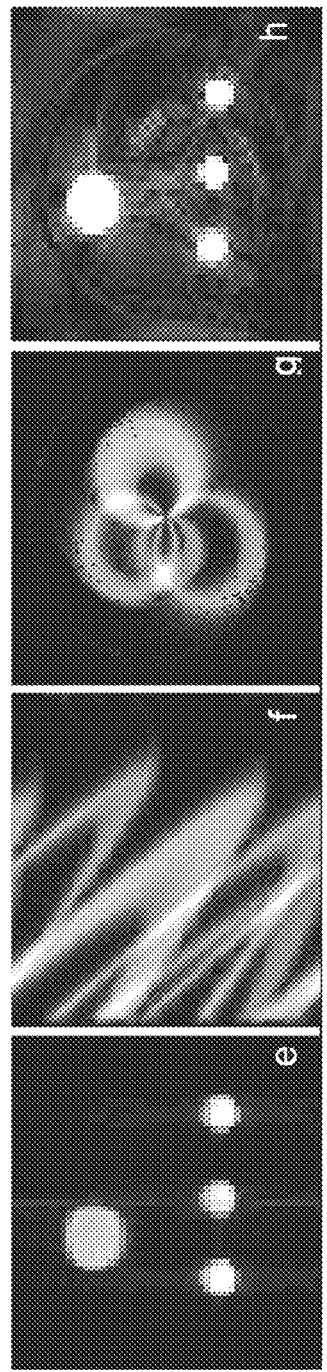
FIG. 8A  FIG. 8B  FIG. 8C  FIG. 8D
FIG. 8E  FIG. 8F  FIG. 8G  FIG. 8H

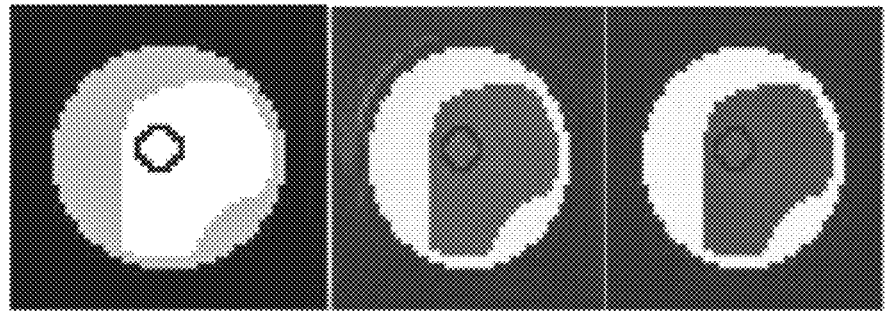
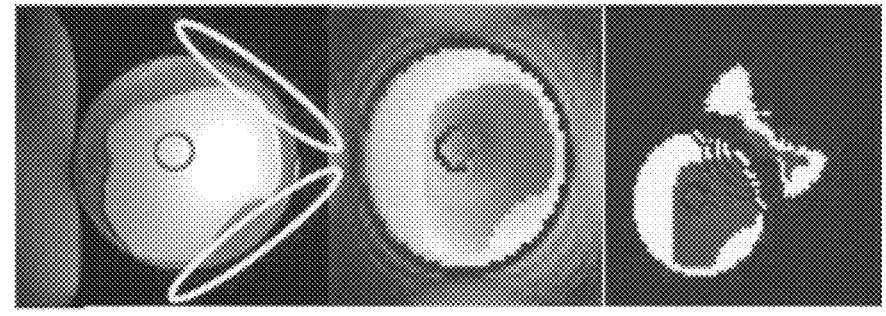
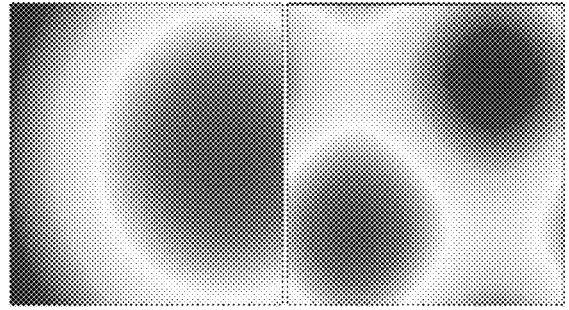
FIG. 12A  FIG. 12B
FIG. 12D  FIG. 12E
FIG. 12G  FIG. 12H
FIG. 12C
FIG. 12F

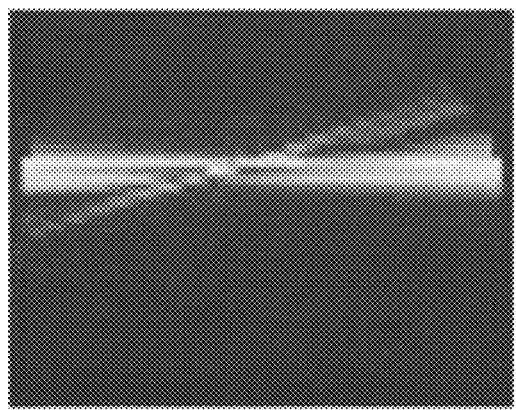
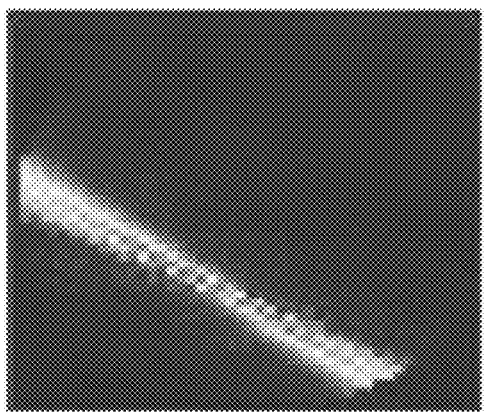
FIG. 15A　　　　　　　FIG. 15B
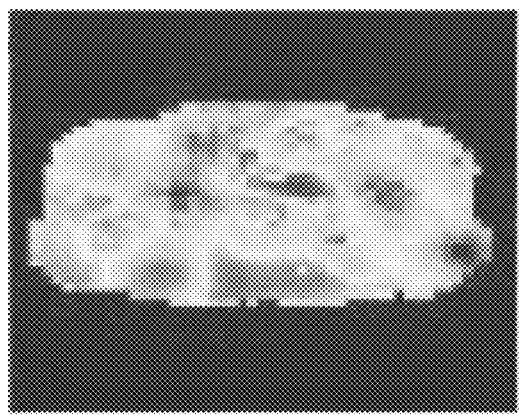
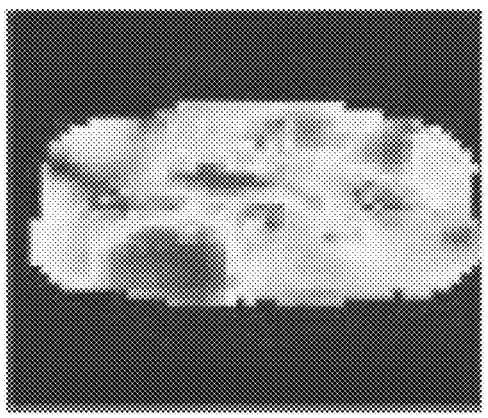
FIG. 15C　　　　　　　FIG. 15D
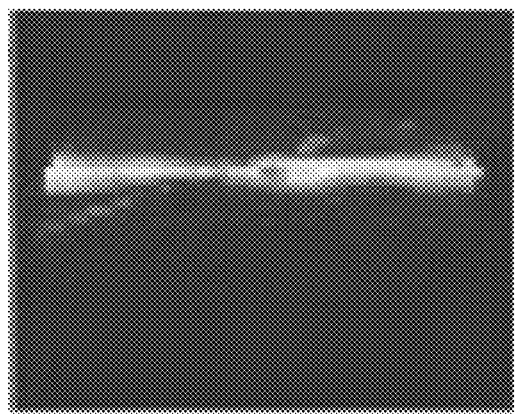
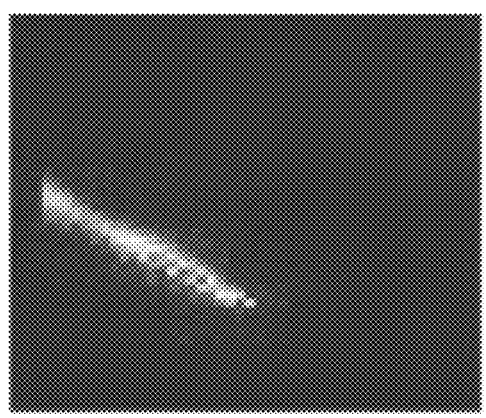
FIG. 15E　　　　　　　FIG. 15F

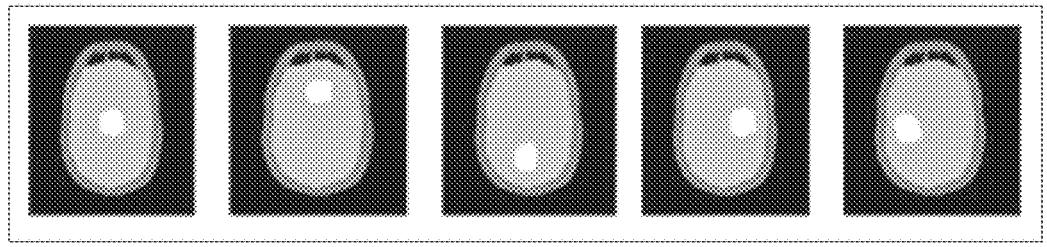
*FIG. 19A*
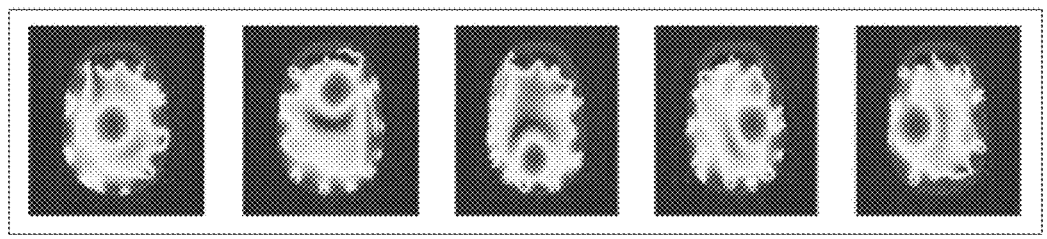
*FIG. 19B*
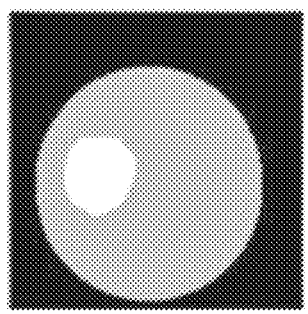 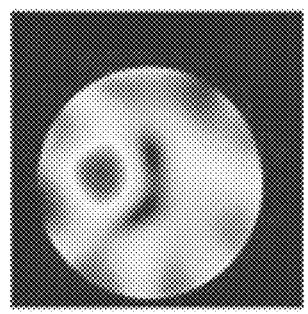 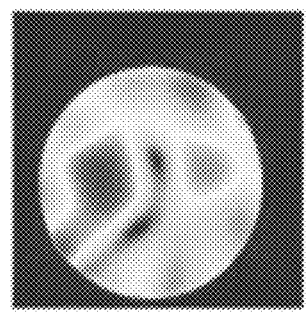
*FIG. 19C*  *FIG. 19D*  *FIG. 19E*

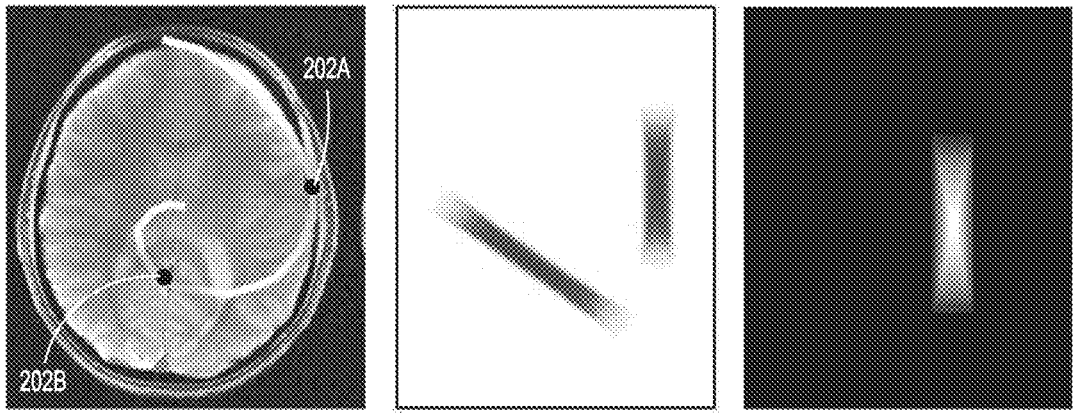
*FIG. 20A*     *FIG. 20B*     *FIG. 20C*
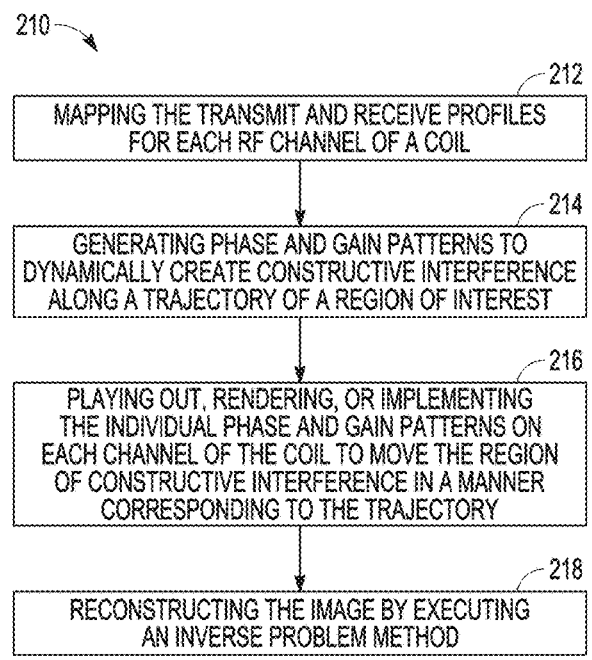
*FIG. 21*

BEAM STEERING WITH RESONANCE ALONG A TRAJECTORY

CLAIM OF PRIORITY

This patent application claims the benefit of priority of U.S. Provisional Patent Application Ser. No. 61/761,470, filed on Feb. 6, 2013, which is hereby incorporated by reference herein in its entirety.

STATEMENT REGARDING FEDERALLY SPONSORED RESEARCH OR DEVELOPMENT

This invention was made with government support under P41 RR008079, S10 RR023730, and S10 RR027290 awarded by the National Institutes of Health. The government has certain rights in the invention.

BACKGROUND

Magnetic resonance imaging (MRI) entails generating an image of a region of interest based on spins excited by a pulse sequence and under the influence of a biasing magnetic field. Increasing the magnetic field strength holds promise of providing improved imaging and faster results. On the other hand, high field systems are very costly and medical care providers may tend to avoid using advanced MRI technologies as a cost saving measure.

In addition to pecuniary considerations, the interest in imaging using higher magnetic fields is frustrated by various factors, including limitations on specific absorption ratio (SAR) and current technology for ensuring a homogeneous magnetic field within the magnet bore.

Among the challenges associated with imaging at 10.5 T and higher are the $B_1+$ inhomogeneities created by interference patterns due to the reduced wavelengths in the human body. The wavelengths of human tissue at the Larmor frequency (at 450 MHz for 10.5 T and 500 MHz at 11.7 T) are approximately 8 cm and 7 cm, respectively in high water content tissues such as muscle and brain. By conventional methods and thinking, these wavelengths would preclude any possibility of achieving safe and successful human-scale imaging.

Radio frequency (RF) interference patterns from conventional, uniform field volume arrays create severe RF field inhomogeneity in the anatomy. RF losses to the tissue may result in excessive heating when conventional pulse protocols are used.

OVERVIEW

If the signal-to-noise benefits of ultra-high field MRI are to be realized, new technologies and methods are needed to improve RF and static magnetic field uniformity (or compensate for non-uniformity) and to minimize SAR and heating over a region of interest. The present subject matter includes solutions directed to various problems, including field inhomogeneity, excessive SAR, and excessive heating.

An example of the present subject matter includes a spatiotemporal encoding MR pulse sequence in combination with a smart, adaptive, or phased RF transmit front-end. The transmitter front-end includes a multichannel transmit array, multiple RF power amplifiers, and a processor. Each amplifier has dynamic phase and gain control over the output waveform. Using a spatiotemporal encoding sequence with this RF transmit front-end facilitates highly spatially localized regions of uniform excitation to be achieved even in the presence of $B_0$ and $B_1+$ inhomogeneities.

In one example, each coil element is coupled to a unique amplifier with independent phase and amplitude control.

In one example, the various degrees of freedom can be controlled by adjusting the impedance of the coil elements themselves or controlled by driving the coil elements differently (for example, by different signals from the amplifiers), or controlled by adjusting impedance and controlling the driving signal.

One channel, according to one example, can be described as independent of another channel. In this context, the term independent indicates that these individual channels (each of which can be associated with an individual coil element) are approximately decoupled and that there is a unique amplifier to control each coil element. As such, the degrees of freedom can be controlled uniquely for each coil element. Individual channels can be reactively decoupled or resistively decoupled.

In conjunction with a spatiotemporal encoding sequence (such as STEREO described herein) a controllable RF transmit front-end enables spatially localized regions of uniform excitation despite $B_0$ and $B_1+$ inhomogeneities. Front-end control in the manner described herein can facilitate management of constructive interference patterns and mitigate or remove visible destructive interference patterns seen in ultra-high field imaging. In addition, such localized control of the excitation may reduce SAR and enable imaging with lower-cost systems. A lower-cost system can include less homogeneous magnets and a lower field scanner.

An example of the present subject matter includes a pulse sequence including a frequency and amplitude modulated RF pulse applied in the presence of modulated gradients to excite signal that can be collected and resolved in an entirely spatiotemporal domain. This example allows reconstruction without conducting a Fourier transform.

The present subject matter can be used for magnetic resonance imaging (MRI), with specific advantages for imaging in inhomogeneous $B_1$ and $B_0$ fields. This is useful for imaging using higher magnetic field strengths, which inherently face more substantial challenges in producing homogeneous static ($B_0$) and transmit fields ($B_1$). This is also advantageous for producing more affordable (and possibly even portable) scanners because generating a homogeneous $B_0$ is one of the largest barriers to producing a relatively low-cost system.

This technique, which does not necessitate a Fourier transform, is particularly unusual in the world of magnetic resonance. According to one example, the present subject matter only excites one region of resonance moving in time, so that it is spatially independent in both transmit and receive, which other spatiotemporal sequences have not been able to demonstrate.

The spatiotemporal dependence of the present subject matter is particularly valuable when dealing with problems that are inherently spatial in nature such as $B_1$ and $B_0$ inhomogeneities, for which the present subject matter can compensate both during the actual sequence, transmit and receive, as well as in post-processing by virtue of the use of an inverse problem reconstruction method. An example of the present subject matter is sometimes referred to as STEREO which is derived from a description as spatiotemporal encoding with incremental refocusing along a trajectory (and considered in terms of steering resonance).

Unlike other methods, STEREO does not require excitation of the entire imaging space simultaneously. One example of STEREO is entirely spatially independent, and allows for correction of complex multi-dimensional $B_1$ and $B_0$ inhomogeneities.

One example entails excitation having a gapped sequence and allows for nearly simultaneous transmit and receive. The excitation is implemented using a gapped frequency and amplitude modulated RF pulse applied in the presence of modulated gradients to alternately excite and acquire for nearly simultaneous transmit and to receive in an entirely spatiotemporal domain. In one example, transmitting and receiving occurs continuously and simultaneously. This configuration achieves benefits of STEREO as well as capturing ultra-short echo time signals. Restated, this combines the advantages of spatiotemporal encoding with the advantages of being able to detect extremely short $T_2$ signals.

Particular configurations of the present subject matter are suitable for high magnetic field imaging, inhomogeneous field imaging, and for imaging of bone with metal implants.

Both MRI and computed tomography (CT) have substantial difficulty imaging near metal implants due to susceptibility or starburst artifacts. STEREO implemented with a simultaneous or nearly simultaneous transmit and receive can compensate for $B_1$ and $B_0$ inhomogeneities and image tissues with very short $T_2$, like bone. This combination is particularly powerful for high field imaging, being able to compensate for increased inhomogeneity and being largely immune to the problems arising from the shortening of $T_2$ that correlates to field strength. Furthermore, this combination of advantages can be especially useful in imaging bone with metal implants as the sensitivity to short $T_2$ signals makes bone visible and susceptibility artifacts less severe, and the ability to spatially compensate for these artifacts may make it feasible to image near metal implants, which can be clinically useful.

One example enables imaging by moving a resonance region in the spatial domain, acquiring data in a time dependent manner, and reconstructing an image without the use of a Fourier transform.

In collecting data in an entirely spatial domain, there is inherently a unique ability to address problems that are spatial in nature like $B_1$ and $B_0$ inhomogeneity compensation.

Gradient shapes as well as RF excitation pulse frequency and amplitude can be modulated and tailored to compensate for field non-uniformities, useful for ultra-high fields as well as inhomogeneous, less expensive, more portable magnets, and possibly for imaging near metal implants.

The trajectory of the region of resonance can be selected to follow a curved path, a spiral path, a circular path, or be a point. Trajectories can thus be nested, or interleaved between spirals or follow a path of concentric or offset and rotated circles.

Data acquisition can be interleaved with excitation or simultaneous (or near simultaneous) with excitation. In addition, acquisition can occur during the excitation or acquisition can occur after excitation. For example, a gapped sequence can be used and acquisition can occur in the time-wise gaps in the pulse, or acquisition can occur during the gaps and after the excitation, or acquisition can occur after the excitation.

In addition to gapped excitation, one example of the present subject can also be configured for use with continuous (and simultaneous) excitation and acquisition.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 8A illustrates a simulated object.

FIG. 8B illustrates a spirogram when acquired with STEREO.

FIG. 8C illustrates a simple geometric assignment used for reconstruction.

FIG. 8D illustrates an inverse problem solution applied to a simulated image.

FIG. 8E illustrates a real object.

FIG. 8F illustrates a spirogram for the real object when acquired with STEREO.

FIG. 8G illustrates a simple geometric assignment used for reconstruction.

FIG. 8H illustrates an inverse problem solution applied to a real image.

FIGS. 12A-12H illustrate field inhomogeneity compensation.

FIGS. 15A-15F illustrate images corresponding to STEREO, beam steering, and STEREO with beam steering.

FIGS. 19A-19E illustrate region of interest localization by B1 vector (phase and magnitude) shimming at 9.4 T.

FIGS. 20A, 20B, and 20C illustrate images corresponding to beam steering.

FIG. 21 illustrates a method according to one example.

DETAILED DESCRIPTION

Part I

Figure 1A:
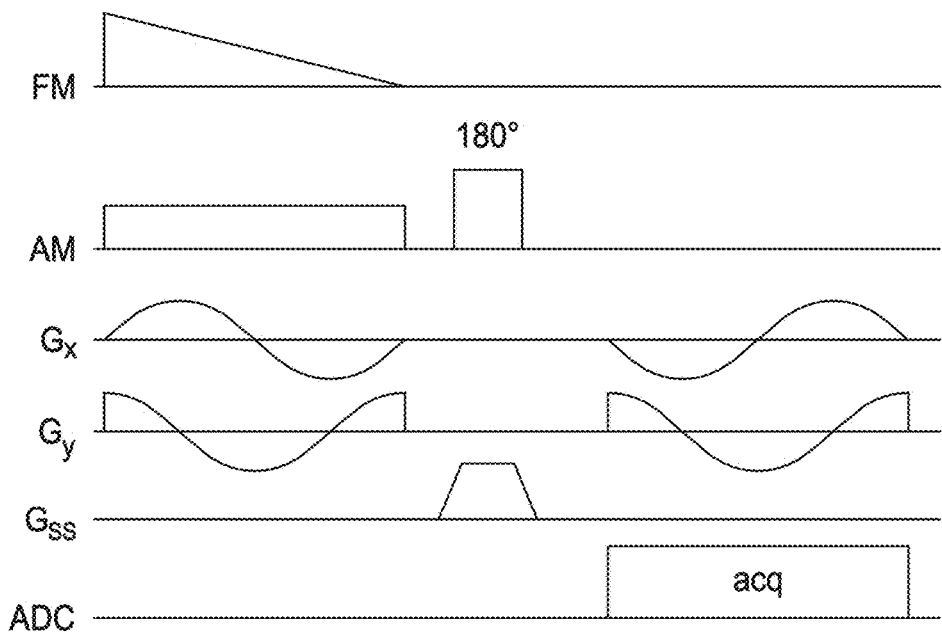
FIG. 1A includes a pulse sequence for 2D TE (two dimensional, time encoding) imaging.

A frequency-swept RF pulse and modulated gradients can be used to move a resonance region through space to generate sequential excitation and subsequent echo formation with time-dependence, which allows image formation without use of the Fourier transform. This two-dimensional time encoding (2DTE) is depicted in FIG. 1A and has the unique property that each region in space can be treated independently, which is potentially of benefit for solving problems that are inherently spatial in nature, such as compensating for $B_0$ and $B_1$ inhomogeneities, which is of increasing interest for higher field strengths. The figure illustrates time wise views of frequency modulation (FM), amplitude modulation (AM), x-axis gradient ($G_x$), y-axis gradient ($G_y$), slice selection gradient ($G_{ss}$), and acquisition (ADC).

Time-encoded MRI has been implemented in several forms. However, all of these implementations involve at least one dimension of frequency or phase encoding with Fourier transform (FT) reconstruction, preventing them from being purely temporal-spatial, or they are not spatially selective during excitation.

Described herein is a methodology for two-dimensional or three-dimensional encoding using only time encoding to produce an image by moving a resonance region along a trajectory in space. Accordingly, no FT is needed for reconstruction, offering the unique capability to treat each region independently, and thus creating the possibility to directly counter spatial imperfections, such as $B_0$ and $B_1$ inhomogeneities.

For example, a single spin echo implementation with an Archimedean spiral and constant radial velocity over $2\pi$ radians is presented. In this case, a chirped frequency sweep terminating at zero frequency offset is applied concurrently with gradients on two axes driven by sinusoids with 90° phase difference. A chirp pulse will generate a quadratic phase profile moving in time.

Figure 1B:
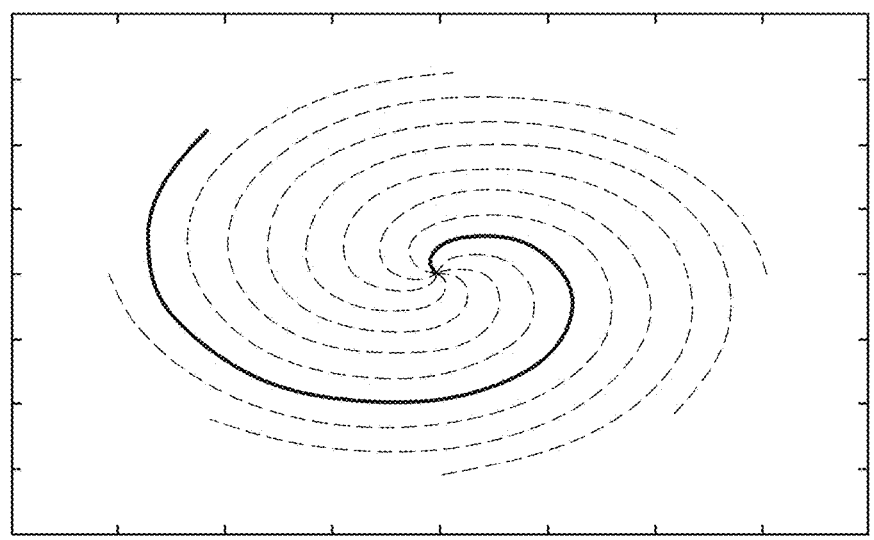
FIG. 1B includes spiral trajectories.

The resonance point follows a spiral trajectory in space, from the maximum radial distance to the center as shown in FIG. 1B. The trajectory of the resonance point has an angular velocity resulting in a curved path such as that of a spiral or a circle. A RF 180° pulse is applied to reverse the phase evolution, and during this pulse, a slice selective gradient may be applied. A hard pulse or sinc pulse can be used for refocusing in order to avoid introducing additional spatially varying phase. During acquisition, the gradient functions are reversed which results in a sequential local refocusing of magnetization along the trajectory, from the center to the maximum radial distance. The sequence can be repeated, changing the angle each time to produce a series of spirals as shown in FIG. 1B (dotted lines), and thereby covering the plane (i.e., the selected 2D slice). The excitation is not in fact a point, but a forward-moving region of excitation traveling along a vector, exciting a plane in space perpendicular to that vector. In 2D, the wave is a line, with the tangential velocity driving the wave along the trajectory and the rotational velocity driving the rotation of the line about its center point. The instantaneous velocity of a point along the line can be described by $ds/dt \propto (r^2+L^2)^{1/2}$ where s is the position, t is time, r is the distance between the center of the spiral and the center point of the line of excitation, and L is the distance of a given point along the line from the center point of the line. Thus the center point has the lowest velocity, and velocity increases the further a point is from the center, quadratically if $|L|<r$ and linearly if $|L|>r$. Note that the spatial trajectory is not a representation of k-space.

Figures 2A, 2B, 2C:
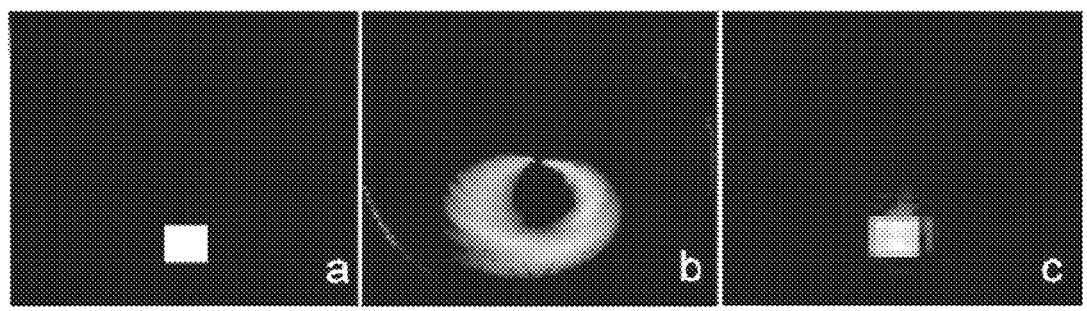
FIG. 2A illustrates a simulated object.
FIG. 2B illustrates simulation results reconstructed with an assignment method.
FIG. 2C illustrates simulation results reconstructed with an inverse problem method.
Figures 2D, 2E, 2F:
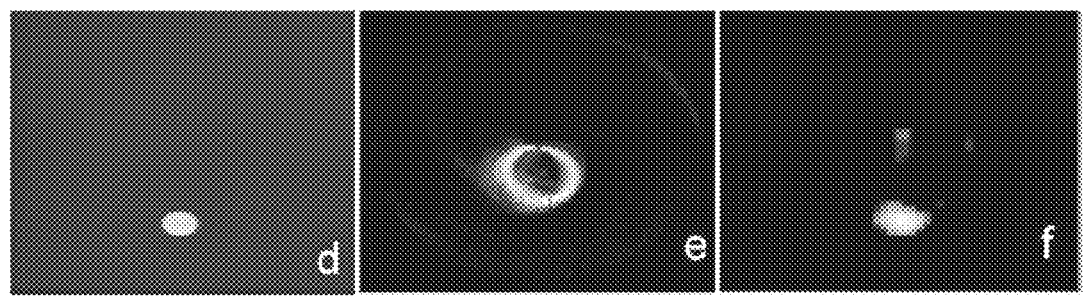
FIG. 2D illustrates a scout image of the phantom used in an experiment.
FIG. 2E illustrates experimental results reconstructed with an assignment method.
FIG. 2F illustrates experimental results reconstructed with an inverse problem method.

A 4 T magnet with a 90 cm bore (Oxford) can be used with a clinical gradient system (Siemens Sonata) and an imaging console (Varian) for all experiments. The phantom can include a 50 ml tube containing water and Gd-DTPA positioned upright in a quadrature T/R surface array, the scout image of which is shown in FIG. 2D. The experiment was performed with $b_w=40$ kHz, pulse length=acquisition window=6.0 ms, TE=21 ms, TR=4 s, and FOV=20 cm, 240 points along the trajectory, and 128 rotations. To validate experimental results, simulations can be performed using Bloch simulations. The simulations can be adjusted to obtain data in the same manner as the experiment. FIG. 2A illustrates a simulated object.

Because the excitation profile is not sufficiently close to a delta function, reconstruction cannot be done by assigning signal along the trajectory according to the known spatial-temporal relationship, which has been used along one dimension with previous time-encoding sequences. FIGS. 2B and 2E show results using the simple assignment reconstruction method, demonstrating its inadequacy. The figure also shows strong correlation between the data from experiments and the data from simulations, indicating that an inverse mapping problem can be employed for reconstruction by using simulations to generate a transfer matrix. The general form of the inverse mapping problem comes from earlier literature and has been employed successfully with other imaging modalities and has been employed in various forms in a few MRI applications. Consider first the forward problem g=Hf, where g is a vector describing the observed data, f is a vector describing the source signal, and H is a transfer matrix. In implementing the inverse problem solution, the aforementioned Bloch simulations can be used to approximate the forward problem and thereby obtain an estimate of H. The pseudoinverse ($H^+$) can be calculated using the least-squares solution of inverse mapping. The pseudoinverse can then be applied to the experimental data to generate an image which is the estimate of the source signal, ($f_{est}=H^+ g$).

If a matrix is equal to its own conjugate transpose, then it is said to be self-adjoint and is called Hermitian. The pseudoinverse, in this case a Moore-Penrose pseudoinverse, is obtained by $H^+=(H^\dagger H)^{-1}H^\dagger$ where $H^\dagger$=conjugate transpose of H.

While not a highly accurate depiction of the object, FIGS. 2B and 2E show strong consistency between the simulation and experiment. The improvements using the inverse problem solution are apparent comparing the assignment reconstruction to the inverse mapping problem reconstruction both in simulation (FIGS. 2B-C) and experiment (FIGS. 2E-F). Some artifacts are present.

Experimental results demonstrate imaging by moving a resonance region in the spatial domain, acquiring in a time dependent manner, and reconstructing without the use of a Fourier transform. The challenge of addressing the artifacts remains, but numerous regularization and filtering options can be implemented for improving the images and opening a myriad of possibilities for applications where spatial independence is important, such as for $B_0$ and $B_1$ inhomogeneity compensation.

Part II

As transmit array coils and higher field magnets increase in popularity, pulse sequences, which compensate for $B_1$ inhomogeneity have become more important. This document describes a compensation scheme based on a spatial excitation accomplished with a frequency-swept pulse and a matching shaped gradient sequence. An example of the present subject matter utilizes the principles of rapid-passage in the linear region. These 2D excitation pulses are different from previous 2D excitation pulses for, although both use gradient modulation, these pulses are frequency-modulated instead of solely amplitude-modulated. The method includes tailored multi-dimensional excitation and can compensate for $B_1$ inhomogeneity in, for example, high field applications and transmit SENSE. Theoretical principles and proof-of-principle are presented using Bloch simulations.

Figure 3:
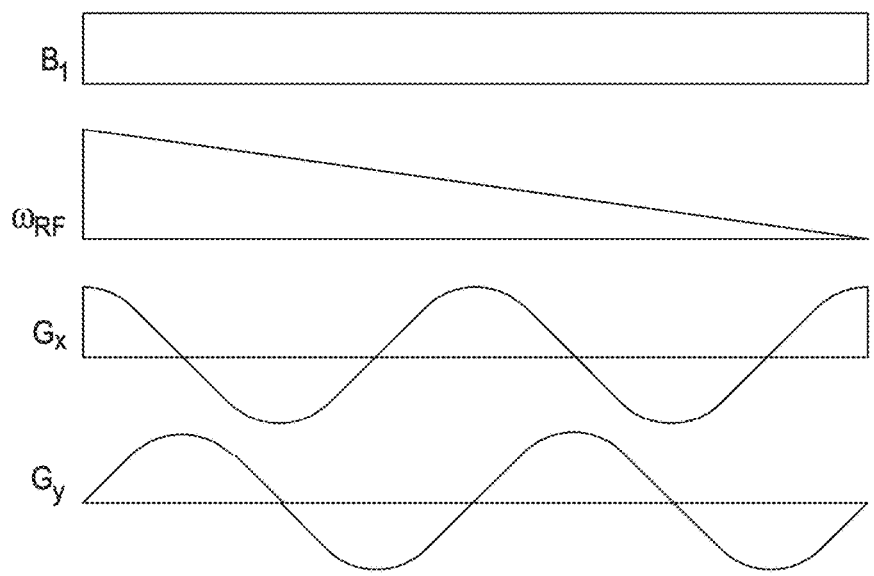
FIG. 3 illustrates a pulse sequence diagram.

An excitation sequence (FIG. 3) employs a chirped RF pulse of constant $B_1$ amplitude with a linearly swept frequency $\omega_{RF}(t)$ which terminates at zero offset. During RF irradiation, sinusoidal gradients are played on two axes (e.g., x and y), which creates a rotating linear gradient. In one example, the time-dependent gradient works in concert with sweeping the pulse frequency to move the resonance point in space in a spiral trajectory toward the center. Excitation is accomplished in the rapid-passage, linear region defined as $$|d(\omega_{RF})/dt| \gg (\gamma B_1)^2 \quad \{1\}$$

which is different from the familiar adiabatic condition, $$|d(\omega_{RF})/dt| \ll (\gamma B_1)^2 \quad \{2\}$$

Figure 4:
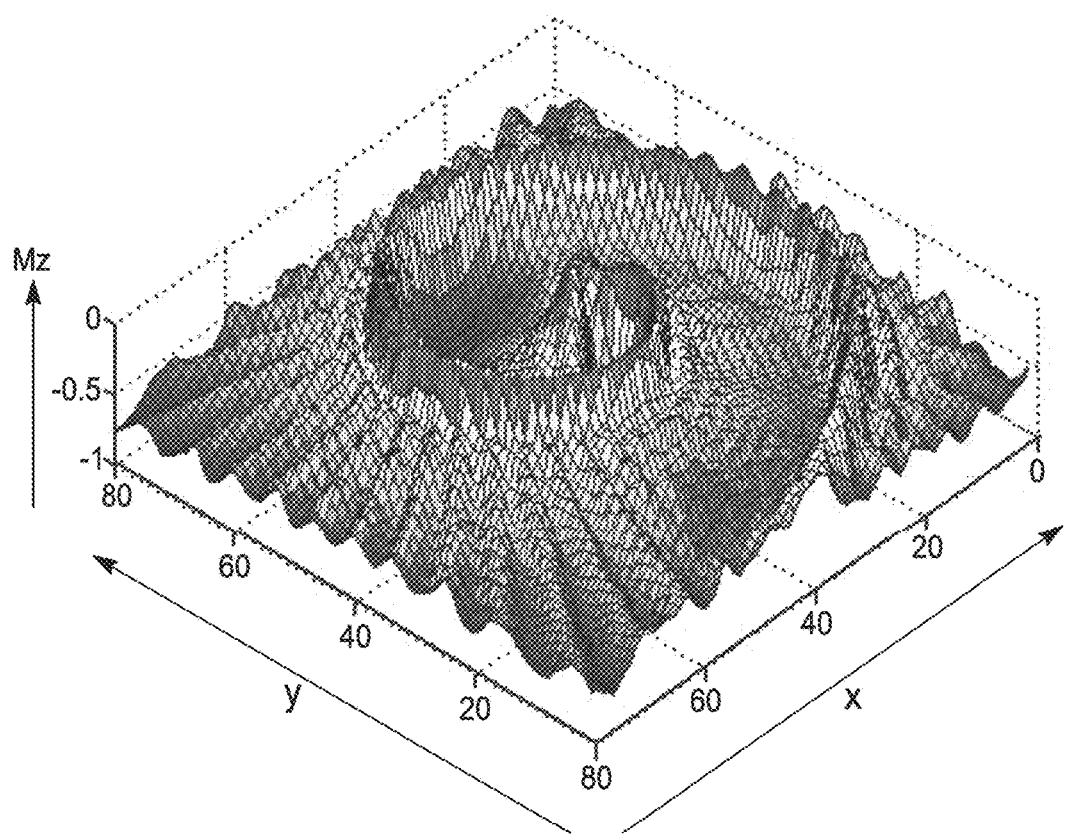
FIG. 4 illustrates longitudinal magnetization ($M_z$) resulting from the frequency-swept 2D spiral excitation.

By satisfying Eq. {1}, spins outside of the narrow band of resonance will not be excited by the pulse. When the sweep of the gradient is sufficiently rapid, only spins in the locality of the moving resonance point will become excited. Thus, the sequence creates a sequential excitation along a spiral trajectory through space. The concept can be evaluated using a Bloch simulation program that allows shaped gradients and displays the resulting magnetization as a function of spatial coordinates. As an example, FIG. 4 illustrates the longitudinal magnetization ($M_z$) resulting from the frequency-swept 2D spiral excitation. The simulations demonstrate time-dependent excitation along a spiral trajectory produced by rapid-passage in the linear region. The simulated results shown in FIG. 4 illustrate the effect of the pulse on the $M_z$ magnetization of a uniform field of isochromats. The negative $M_z$ magnetization is displayed for clarity. The maximum value shown corresponds to a 90° flip. As shown in FIG. 4, simulations depict a sufficiently narrow excitation profile perpendicular to the trajectory.

An example of the present subject matter may be advantageous for rapid imaging using sequences which use time-dependent excitation and echo formation, instead of Fourier transformation, to decode spatial frequencies. Additionally, the sequence can be modified to selectively excite specified regions in space. In principle, the speed of the on-resonance trajectory or the amplitude of the $B_1$ can be varied to produce uniform excitation in the presence of a spatially inhomogeneous $B_1$. Examples of the present subject matter may be advantageous for multi-coil transmit applications and in ultra-high field MR.

Part III

A frequency-swept RF pulse and modulated gradients can be used to move a resonance region through space to generate sequential excitation and subsequent echo formation with time-dependence, which allows image formation without use of the Fourier transform. This method of steering resonance (STEREO) treats each region in space independently. Such spatial independence can be beneficial in applications that are inherently spatial in nature, such as compensating for inhomogeneous $B_1$ and $B_0$, which is of increasing interest for higher field strengths.

Spatiotemporally encoded MRI can be implemented in several forms having advantages over classic frequency and phase encoding in some applications.

An example of the present subject matter includes an approach for entirely spatiotemporal image acquisition that remedies some of the challenges of the earlier imaging methods. This sequence uses time encoding to produce an image by moving a resonance region along a 2D trajectory in space such that the excitation is itself spatially selective. Each region then can be refocused sequentially during acquisition, retaining the spatiotemporal independence that was established in the excitation. Accordingly, no Fourier transform is needed for reconstruction providing spatial independence in acquisition. In addition, the spatial independence of the excitation makes creation of highly tailored traversals of space possible, with inherent freedom facilitating unique treatment of each refocused region, rather than each grid dimension, giving substantially more control for compensating for multi-dimensional $B_1$ and $B_0$ inhomogeneities. Since the resonance region is not sufficiently close to a delta function, reconstruction by merely rearranging the acquired signal to form an image is not ideal, even problematic. In this case, an inverse problem solution is well suited to the reconstruction of the signal into an image. Working entirely in the spatiotemporal domain allows direct treatment of inherently spatial problems. This spatial independence is particularly unusual in MR imaging and thus presents opportunities for novel applications that are unavailable with standard MR techniques.

Spatiotemporal encoding is generated by the application of a gradient in the desired encoding dimension which will impart a spatially dependent range of frequencies. A concurrent RF excitation pulse with a chirped frequency sweep is applied. As the RF frequency is swept, the isochromats at each frequency will be perturbed into the transverse plane sequentially. The phase of each isochromat will be a combination of the phase acquired from the RF excitation and the phase accumulated while freely processing after having been tipped into the transverse plane. By applying a gradient in the opposite direction, the phase of each isochromat can be unwound sequentially. At any given time, the isochromats that are in phase will contribute the majority of the signal. The signal can then be assigned to the corresponding spatial location.

Outer-volume-suppression (OVS) techniques can be helpful to consider. In general, each band of suppression is achieved by selecting a set of gradients and a frequency offset to excite and then suppress a region of signal that is outside the region of interest. A series of bands are selected to surround the object of interest to suppress undesirable signal. Increasing the number of suppression bands can more accurately approximate a continuous suppression region. Instead of using constant gradients for each band, a sine and cosine gradients can be employed to suppress a continuous ring of signal on the outside of a region of interest, such as suppressing the ring of signal from fat and skin surrounding the head. With a constant RF frequency, the ring will have a constant radius. However, if a frequency sweep were used from the maximum offset to zero, then the continuously decreasing radius in the presence of sine and cosine gradients would form a spiral. Rather than suppressing this spiral of excitation, the signal can be preserved, which is how the STEREO pulse sequence begins.

STEREO can be configured for many possible trajectories. For initial discussion, an Archimedean spiral with constant radial velocity over $2\pi$ radians is presented both for the simplicity of the geometric description and for the constant radial velocity. STEREO can be implemented in several forms as shown in FIGS. 5A-5D, including, in FIG. 5A, a gradient echo; in FIG. 5B, a spin echo; in FIG. 5C, a double spin echo; and in FIG. 5D, as a gapped variation of the sequence along with a closer view of a portion of the gapped STEREO sequence showing amplitude modulation (AM), phase modulation (PH), x-axis gradient ($G_x$), y-axis gradient ($G_y$), and acquisition (ADC, corresponding to analog-to-digital conversion). Other examples are also contemplated.

In the Archimedean spiral trajectory, a frequency sweep consisting of a chirp-like pulse terminating at zero offset and keeping constant $B_1$ amplitude is applied concurrently with sinusoidal gradients on two axes offset by one-quarter phase. The resultant trajectory is a spiral from the maximum radial distance to the center with constant angular and radial velocities. The frequency may similarly be swept from zero offset to the maximum frequency offset by creating the spiral starting at the center and proceeding in the opposite direction. Since the $B_1$ amplitude is constant, $\alpha \propto (B_w/T)^{0.5}$ where $\alpha$ is the flip angle, $B_w$ is the bandwidth and $T$ is the duration of the excitation pulse. The distance from the center at any point along the trajectory r is proportional to the bandwidth, and consequently, taking the derivative with respect to time ($d\alpha/dt \propto 0.5 * dr/dt$) shows that constant $B_1$ plus constant radial velocity will produce a constant flip angle along the trajectory. The modulated gradients may initially appear to complicate many of the calculations shared by other time-encoded imaging, especially if attempting to consider one dimension individually. However, considering STEREO in polar coordinates can be more illuminating. Recasting in polar coordinates, $$\theta = \begin{cases} \arctan\left(\frac{G_y(t)\omega(t)}{G_x(t)\omega(t)}\right) & \text{if } G_x(t)\omega(t) > 0 \\ \arctan\left(\frac{G_y(t)\omega(t)}{G_x(t)\omega(t)}\right) + \pi & \text{if } G_x(t)\omega(t) < 0 \text{ and } G_y(t)\omega(t) \geq 0 \\ \arctan\left(\frac{G_y(t)\omega(t)}{G_x(t)\omega(t)}\right) - \pi & \text{if } G_x(t)\omega(t) < 0 \text{ and } G_y(t)\omega(t) < 0 \\ \frac{\pi}{2} & \text{if } G_x(t)\omega(t) = 0 \text{ and } G_y(t)\omega(t) > 0 \\ -\frac{\pi}{2} & \text{if } G_x(t)\omega(t) = 0 \text{ and } G_y(t)\omega(t) \geq 0 \\ 0 & \text{if } G_x(t)\omega(t) = 0 \text{ and } G_y(t)\omega(t) = 0 \end{cases} \quad \{3\}$$

$$r = \sqrt{(G_x(t)\omega(t))^2 + (G_y(t)\omega(t))^2} \quad \{4\}$$

where $G_x$ and $G_y$ are the x and y gradients respectively and $\omega$ is frequency. For the Archimedean spiral form of STEREO, let $g_{rot}$ be the desired degree of rotation along the spiral so that $G_x = A_x \cos(g_{rot})$ and $G_y = A_y \sin(g_{rot})$. Assume the gradients are chosen so that the maximum amplitudes of the x and y gradients are equivalent, $A_x = A_y = A_{xy}$. Equations {3} and {4} simplify to $$\theta = A_{xy} g_{rot}(t) \quad \{5\}$$

$$r = A_{xy} \omega(t) \quad \{6\}$$

In these equations, notice that $\theta$ can be attributed to the action of the gradients, while r arises from the action of the frequency sweep and the gradient amplitude. Defining the range of $g_{rot}$ as 0 to $2\pi$ the angular term can be further simplified.

$$\theta = \frac{2\pi A_{xy}}{T} t \quad \{7\}$$

For an Archimedean spiral trajectory with constant angular and radial velocities, and a chirp-like pulse $$\frac{d^2\theta}{dt^2} = \frac{d^2r}{dt^2} = \frac{d^2\omega}{dt^2} = 0 \quad \{8\}$$

which means that $\theta \propto r \propto \omega \propto t$. This relationship is useful since it allows interchange with respect to which value a function is to be considered.

Figure 5A:
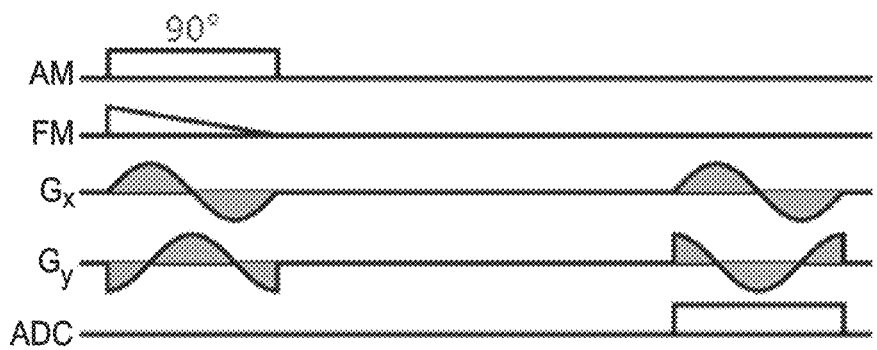
FIG. 5A illustrates a diagram for Gradient Recalled Echo (GRE) STEREO.
Figure 5B:
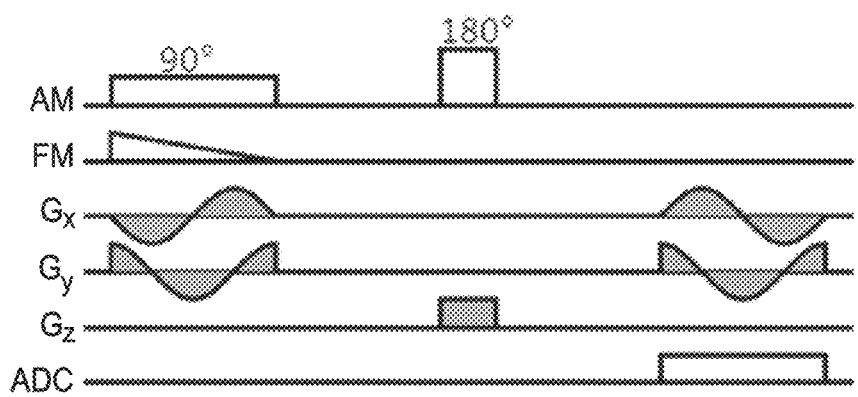
FIG. 5B illustrates a diagram for Spin Echo (SE) STEREO.
Figure 5C:
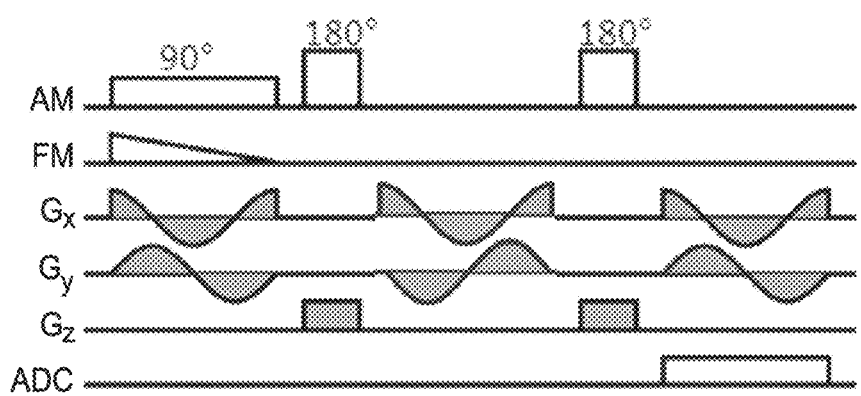
FIG. 5C illustrates a diagram for double SE STEREO.

In the case of the gradient echo (FIG. 5A), repeating the sinusoidal gradients during acquisition allows for the sequential encoding of signal, not in the traditional form of a series of echoes, but rather as a wave of signal arising from the spatially and temporally continuous nature of the frequency swept excitation. For the spin-echo versions of STEREO (as shown in FIG. 5B and FIG. 5C), one or more radio frequency 180° pulses may be applied to reverse the phase evolution, and at that time a slice selective gradient may be added. For the single echo implementation of STEREO, a hard pulse or sinc pulse can be used for inversion in order to avoid introducing additional phase, whereas a double echo sequence opens RF pulse shape options to include adiabatic inversion pulses from the HSn family as the phase introduced by the first inversion pulse will be removed by the second. These adiabatic pulses bring advantages including uniform inversions even in the presence of RF field non-uniformities. Applying the excitation gradient shapes in reverse will result in the sequential phase refocusing along the trajectory in the opposite direction of the excitation.

Similar to the gradient echo form of STEREO, the resultant signal over time is not a classic echo, but rather a series, or wave, of echoes, which may be acquired during the application of this reversed set of gradient shapes in the single echo case, or again inverted and acquired during the application of a set of gradients matching the first in the double echo case. The double echo form provides constant TE across the image and improved $T_2$ contrast. In addition to the gradient echo and spin echo versions of STEREO shown here, STEREO can also be implemented with a gapped acquisition method. An excitation pattern similar to the other implementations can be used along with gaps in the RF pulse during which time, the signal may be acquired for nearly simultaneous transmit and receive, bringing some of the advantages of ultra-short imaging methods into an entirely spatial domain.

Figure 5D:
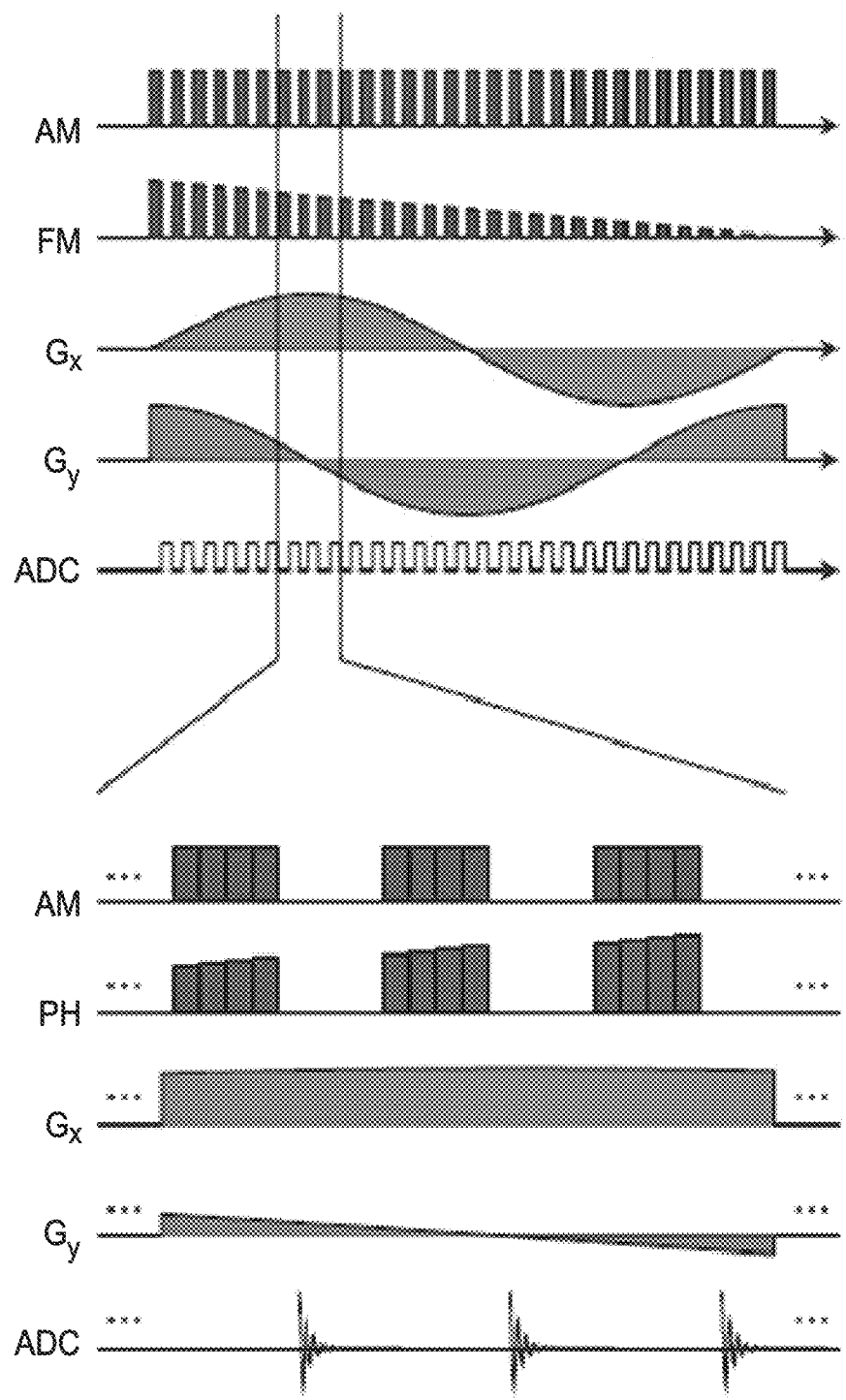
FIG. 5D illustrates a diagram for gapped STEREO along with a magnified portion of gapped STEREO to show the gapping.

FIG. 5D illustrates a magnified portion of the sequence as it relates to the gapping pattern. The proportion of time during which the RF pulse is turned on is called the duty cycle (dc). If the excitation and acquisition were truly simultaneous (rather than alternating), the duty cycle would be 1. With currently available hardware, a duty cycle of 0.25 is more reasonable for experiments and provides sufficient time between excitation and acquisition for coil ring-down.

Figure 6C:
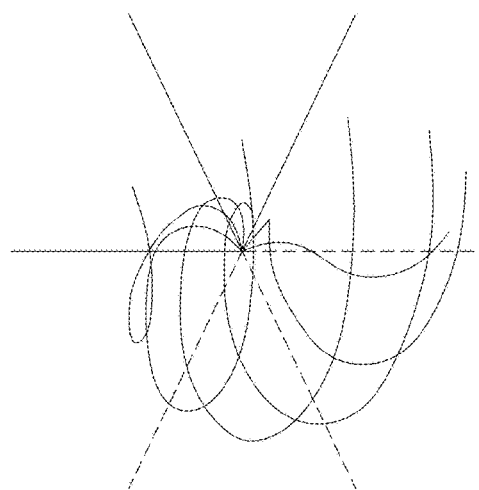
FIG. 6C illustrates STEREO trajectories implemented as a 3D sequence.
Figure 6B:
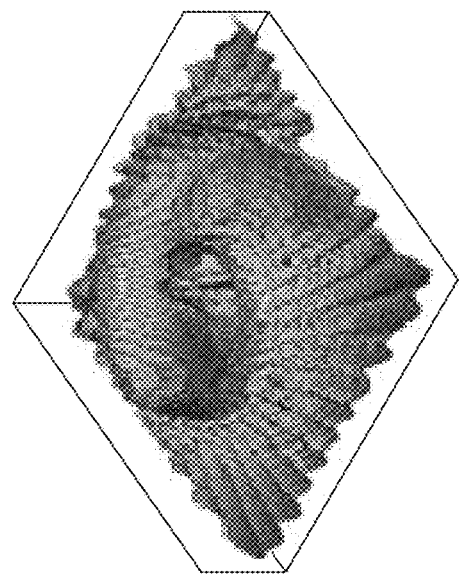
FIG. 6B illustrates the inverse magnitude of the z-magnetization from a simulation of STEREO excitation.
Figure 6A:
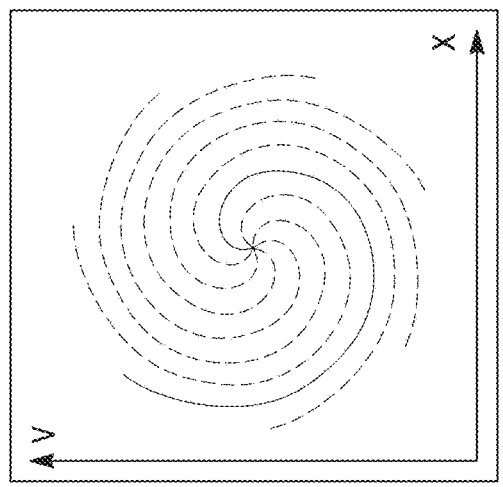
FIG. 6A shows rotation of trajectories to fill a 2D space.

Repetition of the trajectory with different initial angles or phases of the gradients can be used to sufficiently cover a two-dimensional area as shown in FIGS. 6A-6C, which adds an additional term describing the degree of rotation $\theta_i$ onto Equation {7} becoming $$\theta = A/T^* t^* 2\pi + \theta_i \quad \{9\}$$

The r term remains the same.

FIG. 6A shows the rotation of trajectories to fill the 2D space. FIG. 6B illustrates the inverse magnitude of the z-magnetization from a simulation of STEREO excitation. FIG. 6C illustrates STEREO trajectories implemented as a 3D sequence.

The sequential excitation and subsequent echo formation along the trajectory produces a time-dependent signal. The dephasing of signal from each isochromat is sufficiently rapid such that the maximum signal at a given time point can be attributed to the refocused isochromats, which can be thought of as a resonance region moving through space. If the profile of the resonance region is sufficiently narrow as to be essentially equivalent to a delta function, then reconstruction can entail assigning temporal data to their corresponding spatial position along the known trajectory, thereby producing an image. However, for certain conditions, this delta function assumption may not hold and thus neither does the geometric reconstruction.

Consider next, the characteristics of the resonance region. A frequency and amplitude modulated excitation pulse produces not a point but rather a forward-moving wave of excitation. This wave travels along a vector and excites a plane in space perpendicular to that vector. The RF pulse determines the velocity of the vector while simultaneous gradients can be used to control the direction of the vector.

Considering a singular slice perpendicular to the plane simplifies this problem to a 2D situation; as such, the wave is now a line of excitation traveling along an instantaneous vector. The simultaneous rotation induced by the gradients adds a rotational velocity that will be zero at the centroid (the point along the line that is on the spiral trajectory) and impart more rotational velocity to the points along the line increasing with their distance from the centroid. The profile of the excitation along this line determines the resolution of the image tangential to the trajectory of excitation. The point spread function can also be dictated by the profile perpendicular to the trajectory, or the cross-sectional profile of the moving line of excitation. Further, consider the profile along the path of the centroid, which is somewhat akin to the determination of the resolution along the time-encoded dimension in sequences such as RASER. Each profile can be considered separately.

The movement of the wave, or line, of excitation tangential to the trajectory can be represented as two components, the tangential velocity driving the centroid along the trajectory and the rotational velocity of the line about the centroid. The perpendicular profile will arise from a combination of the angular velocity imparted by the gradients and the centrifugal velocity generated by the frequency sweep. This is shown in FIG. 7 which illustrates the signal profile with axis 72 (horizontal) showing the line tangential to the signal trajectory and with axis 74 (vertical) showing the profile of excitation perpendicular to the trajectory from the double echo version of STEREO.

The excitation at the centroid will be dependent only upon the tangential velocity, while the excitation at every other point along that line is determined by both the tangential velocity and the rotational velocity of the line of excitation about the centroid. Thus, the excitation of any point on the tangential line is proportional to its distance from the centroid. As the line of excitation travels along the defined trajectory, those isochromats falling within the excitation line at a point nearer the centroid have lower instantaneous velocity and experience more RF energy and subsequently contribute proportionally more signal during acquisition than those isochromats in the excitation wave located further from the centroid. The profile in FIG. 7 is calculated from Bloch simulation.

Now, consider the profile of excitation of the wave perpendicular to the trajectory. Conversion to polar-coordinate space shows STEREO as a frequency sweep with a constant gradient, revealing that the perpendicular profile resembles that of a frequency swept pulse without time encoding, dependent primarily on the sweep rate. This profile is the narrowest.

Figure 7:
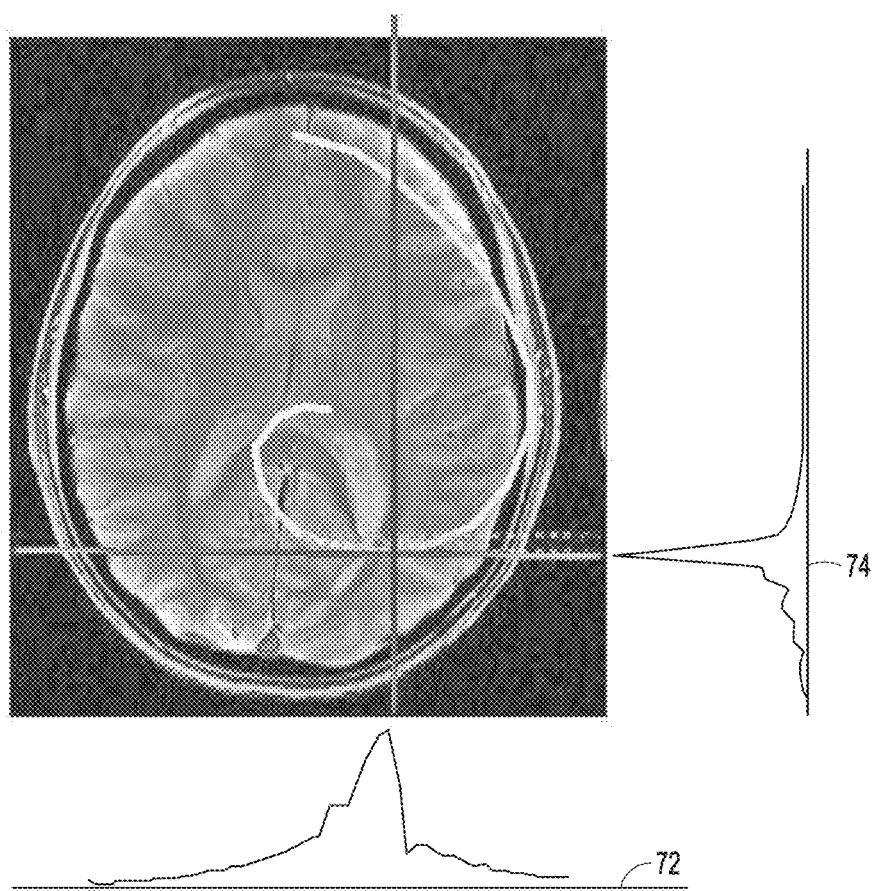
FIG. 7 illustrates the signal profiles according to one example.

The profiles in FIG. 7 show that while the maximum signal is well localized to the expected trajectory, because the acquired signal is a summation over whole spatial domain, the contributions from other regions, while contributing proportionally much less signal, contribute substantially to the collected signal when summed, indicating that a geometric assignment of signal is but one method of reconstruction and that other methods can also be considered.

Geometric assignment can be evaluated using Bloch simulations with two spatial dimensions.

The inherently spatial nature of STEREO makes it well suited to $B_1$ and $B_0$ inhomogeneity compensation. The modulation of gradients, RF amplitude, and RF frequency allows various degrees of freedom for compensation. By mapping the $B_1$ inhomogeneity and knowing the trajectory of the region of resonance, the RF amplitude can be modulated to compensate by, for example, increasing the amplitude proportionally when the resonance region is in an area of low signal. Similarly a $B_0$ map and known trajectory can be used for compensation for main magnetic field variations. The RF frequency and gradients can each be modulated to follow the desired trajectory in the presence of $B_0$ inhomogeneities. The capacity to independently adjust for the main magnetic field and RF field actually experienced by each resonance region gives this compensation method particular flexibility and robustness in the spatial domain.

Simulations can be performed based on the Bloch equations. Results from these simulations can be used to show the sequential excitation along a trajectory in the rapid-passage, linear region. The full trajectory z-axis magnetization pattern in FIG. 6B can be created using a half chirp pulse and sinusoidal gradients to produce an Archimedean spiral with parameters Tp=20 ms, bw=27.5 kHz, and field of view (FOV) of 51×51. FIG. 6B features a narrow ridge with relatively consistent amplitude. Simulations can also be used to predict the behavior of the sequence in acquisition. In the case of STEREO, to replicate the experimental acquisition the signal can be summed over the whole space for the duration of the acquisition. As with the experiment, data collected for each of the rotated spirals can be combined to form an image.

FIG. 8A shows a simulated 2D object consisting of three small circles and one large circle, all with uniform signal intensity. FIG. 8B shows the data that can be acquired from a simulation displayed such that the horizontal axis is the time-dependent acquisition and the vertical axis is a series of separate spirals ordered according to rotation about the through-plane axis, together forming a spirogram. In the spirogram, the number of interleaved spirals are depicted on the vertical axis and the horizontal axis depicts the number of points along the trajectory (which can also be viewed as a time-wise representation). FIG. 8C and FIG. 8D show the reconstructed data using geometric assignment reconstruction method and the inverse problem reconstruction methods, respectively. These also show that the aforementioned invalidity of assuming the signal is sufficiently close to a delta function and the consequent inadequacy of geometric reconstruction. The simulation data for FIGS. 8A-8D can be generated with simulation parameters $b_{W,excitation}$=40 kHz, $b_{W,acquisition}$=80 kHz, Tp=at =6.0 ms, TE=21 ms, and since each spiral is simulated separately with no memory of the previous spirals, the TR can be considered infinite. In this example, the trajectory is an Archimedean spiral traversed with constant angular velocity. An exception to these parameters is that to maintain the same flip angle in spite of the gaps, the gapped STEREO pulse is run with the RF amplitude or pulse duration increased proportional to 1/dc, the latter chosen here, imparting a smaller bandwidth. Beyond validation of expectation and experimental results, the predictive power of simulations is helpful in reconstruction for the generation of the transfer function for the inverse problem solution, which is described and discussed later.

FIGS. 8A, 8B, 8C, and 8D illustrate a simulated object and FIGS. 8E, 8F, 8G, and 8H illustrate a real object. The resulting spirogram when acquired with STEREO is shown in FIG. 8B and FIG. 8F. If a simple geometric assignment is used for reconstruction, FIG. 8C and FIG. 8G are produced. However, when an inverse problem solution is used, the resulting simulated image is shown in FIG. 8D and the resulting experimental image is shown in FIG. 8H.

Experimental data can also be generated. A 4 T magnet having a 90 cm bore diameter (Oxford Magnet Technology, Oxfordshire, UK) can be used with a clinical gradient system (Sonata, Siemens, Erlangen, Germany) and an imaging spectrometer console (Unity Inova, Varian, Palo Alto, Calif.) for some experiments. The RF array for both transmit and receive can be a quadrature surface array having two loops. In the experiments described here, one 50 mL test tube and three 10 mL test tubes can be positioned upright in the array, and the images collected in the coronal plane. STEREO experimental results can be collected using a double-echo sequence with inversion pulses from the hyperbolic secant family. The experiments can be performed with $b_{W,excitation}$=40 kHz, $b_{W,aquistion}$=80 kHz Tp=at =6.4 ms, TE=21 ms, and TR=4 s. The pulse powers can be calibrated by arraying the pulse width. The FOV has a diameter of 20 cm. The number of complex points along the trajectory can be 512, and the number of rotated spirals collected can be 128, thus following an Archimedean spiral trajectory with constant angular velocity.

The typical Fourier transform reconstruction employed for many MR imaging methods is unnecessary for this sequence. Further, geometric reconstruction is insufficient, assigning signal along the trajectory according to the known spatial-temporal relationship, which has been used along one dimension with previous time encoding sequences. Because the excitation profile is not sufficiently close to a delta function, a geometric method may be too simplistic, as can be demonstrated in both simulation and experiment (FIG. 8C and FIG. 8G). The similarity between the simulation data and the experiment data suggests using an inverse mapping problem to generate a more accurate image by calculating the least-squares solution.

Inverse mapping can be used with MRI for data collected using standard encoding, which is useful for addressing Gibb's ringing, but time and computational demands favor Fourier methods in the vast majority of circumstances. Similar methods have been applied in MRI along one dimension for enhanced resolution.

Figure 9A:
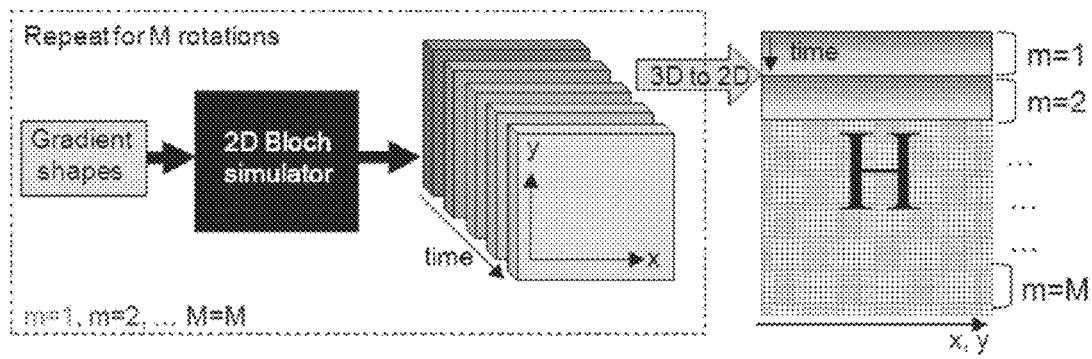
FIGS. 9A, 9B, and 9C illustrate a schematic diagram for the inverse problem reconstruction.
Figure 9B:
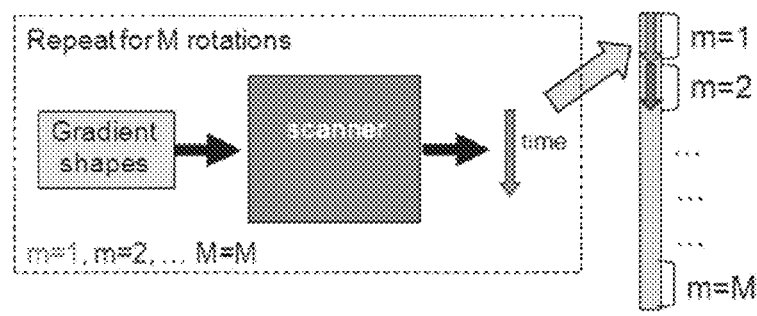
Figure 9C:
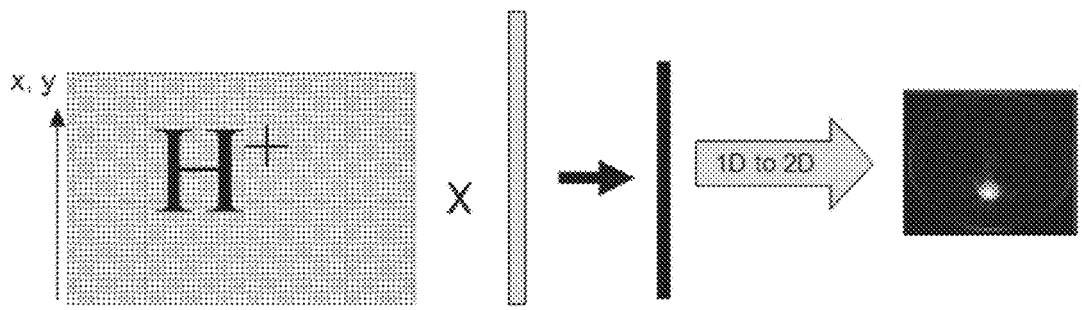

Generating and implementing the inverse problem solution for an example of STEREO is displayed graphically in FIGS. 9A, 9B, and 9C where H is the transfer matrix and $H^+$ is the pseudoinverse of that matrix. In one example, STEREO reconstruction involves four dimensions, namely x, y, time, and rotation. Since inverting a two-dimensional matrix is a better understood and more frequently addressed problem, the four dimensions can be condensed into two dimensions, treating x and y as one dimension (the range space), and time and rotation as the other (the domain space). A Bloch simulation program can be used to approximate the forward problem and thereby obtain an estimate of H. A computer-implemented program can be configured for calculating a pseudoinverse using singular value decomposition (SVD), regularization, and other functions. The condition number of the transfer function applied to the shown images is 17.8, and as such, the matrix is well conditioned.

The condition number is a ratio of the largest to smallest singular value in the singular value decomposition of a matrix. The logarithm of the condition number is an estimate of how many digits are lost in solving a linear system with that matrix. In other words, it estimates worst-case loss of precision. A system is said to be ill-conditioned if it is too large, where "too large" means roughly the log of the condition number should be greater than the precision of the matrix entries. The singular value decomposition of a matrix (H) is given by H=UDV† where U and V are unitary matrices and D is a diagonal matrix whose elements are the singular values of H.

The pseudoinverse can be truncated or regularized by removing the smallest singular values which add stability to the system.

The inverse problem reconstruction method entails use of an inverse of the transfer function. Consider the expression s(t)=Hf(x,y) in which s is the experimentally obtained signal, H is the transfer function generated using Bloch simulation, and f(x,y) is the object (spin density). As such, the transfer function is inverted to obtain $f(x,y)=H^{-1}s(t)$ to yield the image. In this representation, the signal can be depicted using a spirogram.

FIGS. 9A, 9B, and 9C illustrate a schematic diagram for the inverse problem reconstruction. FIG. 9A illustrates the forward problem. FIG. 9B illustrates the experimental acquisition. FIG. 9C illustrates the inverse problem reconstruction.

Applying the resulting solution to experimental data consistently produces images of the phantom both in simulation and experiment. For FIG. 8D and FIG. 8H, H is the same. Further, the same matrix can be used for any simulated or experimental data collected with the same parameters. From FIGS. 8A-8H, improvements using the inverse problem solution for reconstruction, rather than a geometric solution, can be seen in both simulation and experiment.

Figure 10A:
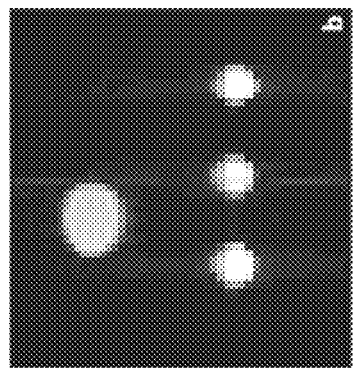
FIG. 10A illustrates an experimental image acquired at 4 T with a double echo STEREO sequence and reconstructed with an inverse problem solution.
Figure 10B:
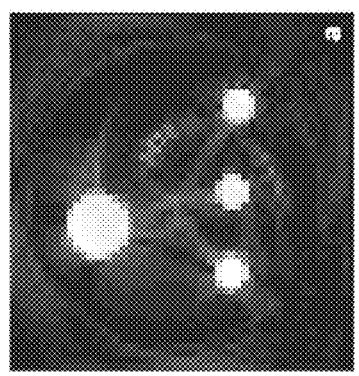
FIG. 10B illustrates a GRE scout image of the object collected at a comparable resolution.

An experiment using four tubes in cross-section (three small and one large), is shown as reconstructed by using an inverse problem solution in FIG. 10A based on acquired data at 4 T with a double echo STEREO sequence. FIG. 10B shows a gradient echo scout image of the object collected at a comparable resolution. Both STEREO and GRE images are shown with 51×51 resolution. The image shows minimal artifacts.

Figures 11A, 11B, 11C, 11D:
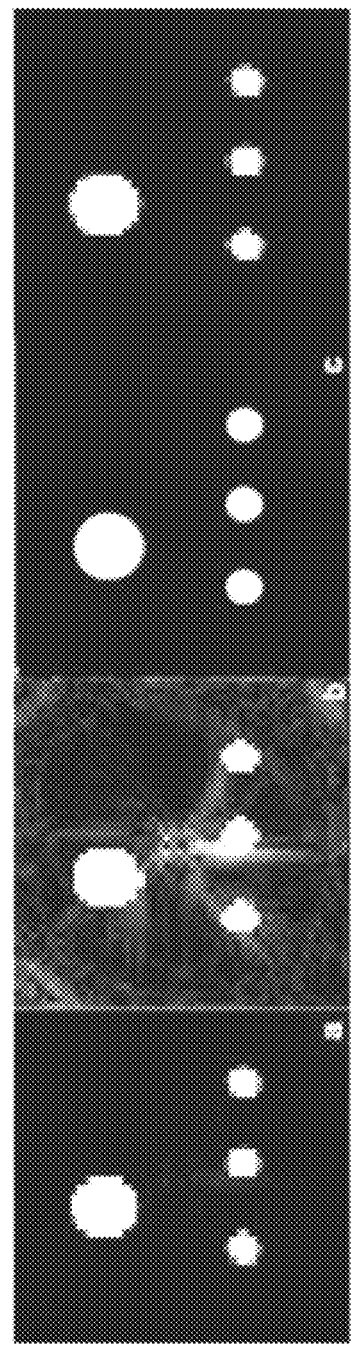
FIGS. 11A-11D illustrates a gapped STEREO simulated experiment.

A gapped STEREO experiment can be simulated and the results are shown in FIGS. 11A, 11B, and 11C. The double echo STEREO results reconstructed with an inverse problem method are shown in FIG. 11A. A gradient echo scout image is shown in FIG. 11D for comparison. A duty cycle of 50% was used with 16-times over-sampling, meaning that in the file that describes the RF shape, 16 points are used to describe each cycle. The artifacts associated with this imaging method are negligible such that the window and level of the image are substantially narrowed and lowered to show any differences from the 2D simulated signal intensity map.

FIG. 11A shows an image acquired in simulation with gapped STEREO. FIG. 11B shows the same image as FIG. 11A but with the noise scaled up ten times in order to show the artifacts. FIG. 11C is the simulated object displayed with high resolution, and FIG. 11D shows the simulated object scaled to the acquired resolution of 51×51.

To demonstrate the flexibility of STEREO to compensate for $B_1$ inhomogeneities, a two-dimensional inhomogeneity pattern (shown in FIG. 12C) can be applied during simulations. The inhomogeneity pattern illustrated resembles the field generated by a pair of loop coils generating a circularly polarized field, in this case an array designed for breast imaging. A simulated phantom can be chosen to look like the phantom used for testing the breast imaging coil. The phantom can be seen in FIG. 12A with the approximate position of the loops. FIG. 12B shows the simulated phantom. The double-echo version of STEREO can take advantage of the robustness of the adiabatic HSn pulses despite the field inhomogeneities.

FIGS. 12A-12H illustrate field inhomogeneity compensation. The $B_1$ and $B_0$ inhomogeneities are shown in FIGS. 12C and 12F, respectively. The corresponding inhomogeneous images are shown in FIGS. 12D and 12G. The images with inhomogeneity compensation are shown in FIGS. 12E and 12H.

The result of applying the inhomogeneity is shown in FIG. 12D. A 51×51 resolution was used. Given a map of the $B_1$ inhomogeneity, new RF pulse shapes can be generated for each of the spirals, which can be designed to compensate for the $B_1$ inhomogeneity during the actual experiment. These new RF shapes can be used to generate the image shown in FIG. 12E.

In addition, STEREO can be configured to address $B_0$ inhomogeneities. The theory can be described in detail for 1D time encoding and extended to STEREO using methods much like those used for the $B_1$ compensation. Should compensating for either $B_1$ or $B_0$ during the experiment be undesirable or unfeasible for some reason, the inverse problem can easily be used to compensate in post-processing. This method also entails some prior knowledge about the RF profile or static magnetic field, meaning that a map of the inhomogeneities is available. Applying the map to the simulation when generating the transfer matrix will then yield a matrix that compensates for the inhomogeneity.

STEREO can be tailored to independently treat regions of resonance during both receive and excitation. Thus, STEREO provides advantages over sequences having one or more dimensions of frequency or phase encoding as well as advantages over entirely spatially encoded sequences that lack independence in their excitation scheme. The degrees of freedom allowed with spatially independent excitation make STEREO better suited to compensate for multi-dimensional field non-uniformities.

One example of the present subject matter provides a solution to an inverse problem with spatially encoded data. Reconstruction requires time and computational power, however these demands can be reduced by preparing a library of transfer functions ready to be applied to data sets generated with the same parameters. With such a library, inverse problem reconstruction is comparable to Fourier reconstruction.

By modulating a frequency swept pulse and simultaneously applying shaped gradients, a trajectory in the spatial domain can be carefully defined. Multidimensional control in the spatial domain offers advantages in compensating for $B_1$ and $B_0$ inhomogeneities. Using $B_1$ and $B_0$ maps, the RF amplitude, phase, and frequency sweep can be modulated to address non-uniformities. This can increase the flip angle in regions with low $B_1$ to produce a more homogeneous image while maintaining sufficiently low SAR values, which is of particular importance for ultra-high magnetic field applications.

For $B_1$ inhomogeneities, compensating during the experiment will be better for recovering more signal. However, should a situation arise that compensation cannot be done during the experiment, compensating in the post processing is also contemplated. Conveniently, the field maps needed for the post processing will already have been acquired for the experimental method. Using the two methods together, or in concert with other shimming methods, is also possible. In addition to the gradient echo and spin echo versions of STEREO shown here, STEREO can also be implemented with a gapped acquisition method. In one example, the excitation includes time-wise gaps but otherwise has a form similar to other implementations described herein. A time signal may be acquired during the gaps, thus yielding nearly simultaneous transmit and receive.

Part IV

STEREO (corresponding to steering resonance) can be viewed as spatial-encoding with incremental refocusing along a trajectory and includes a pulse sequence that functions entirely in the spatiotemporal domain. Sinusoidal gradient modulation in the presence of a frequency sweep can be used to generate a small, localized, moving region of excitation in space. The signal can be sequentially refocused and acquired in the spatiotemporal domain such that Fourier transform reconstruction is not needed. While each region of excitation is independent, an inverse solution is used for reconstruction.

An example of the present subject matter includes a spatiotemporal encoding MR pulse sequence in combination with a multi-channel, dynamically controlled RF transmit front-end. The front-end, in one example, is controlled by a processor executing an algorithm. The front-end is coupled to a multi-channel array. The transmit module or RF transmit front-end provides an RF signal that is dynamically controllable in phase, amplitude, time, and frequency.

Unlike beam forming techniques (such as $B_1+$ shimming or Transmit SENSitivity Encoding, or SENSE) which entail "static" $B_1$ shimming and acquisitions collected in Fourier space, an example of the present subject matter uses spatiotemporal encoding and dynamically changes the $B_1+$ shim, throughout the pulse sequence.

Dynamic shimming of the transmit $B_1$ can enable removal or suppression of destructive interference patterns commonly associated with imaging at ultra-high field strengths. Current beam steering techniques that use Fourier space encoding are inadequate because they cannot adequately suppress signal from outside the region of interest. In addition, current $B_1+$ shimming techniques for use with a body are inadequate because of the reduced wavelengths in the body.

Beam steering entails controlling the direction of a lobe of a radiation pattern. In examples of the present subject matter, beam steering can entail switching antenna elements (for example, coils) or can entail modulating any of the relative phase, amplitude, time, or frequency of the RF signals provided to the transmit array.

In one example, beam steering in conjunction with a spatiotemporal encoding sequence enables imaging along a curved pathway. A user can select the pathway and generate an image corresponding to a curvature of the specimen. For example, the trajectory or pathway can be curved to align with a jaw for purposes of imaging teeth or dental structure. Another example allows tracking of curvature with a gastrointestinal tract such as a colon or an intestine. In some examples, large organs (such as a liver at 7 T or a head at 10.5 T) can be imaged using the present subject matter.

When combined with a parallel transmit system, STEREO can be used to provide homogeneous imaging at ultra-high field strengths. One example of STEREO uses a frequency swept pulse and modulated gradients to dynamically move a region of excitation along a trajectory and sequentially refocus and acquire the in-phase spins, thereby scanning an anatomic region of interest.

A fully parallel transmit RF front-end adjusts the phase, magnitude, and frequency of each RF pulse (or signal) to dynamically steer the focal region of constructive interference of field contributions from multiple transmit elements across the imaged region. In one example, beam steering is used to trace the same spiral path that STEREO is encoding.

In one example, the front-end is controlled by a processor executing an algorithm. The processor can control the movement of the regions of destructive interference and constructive interference to trace the same path (e.g., curved, spiral, circular, point) that STEREO is encoding.

Figure 13:
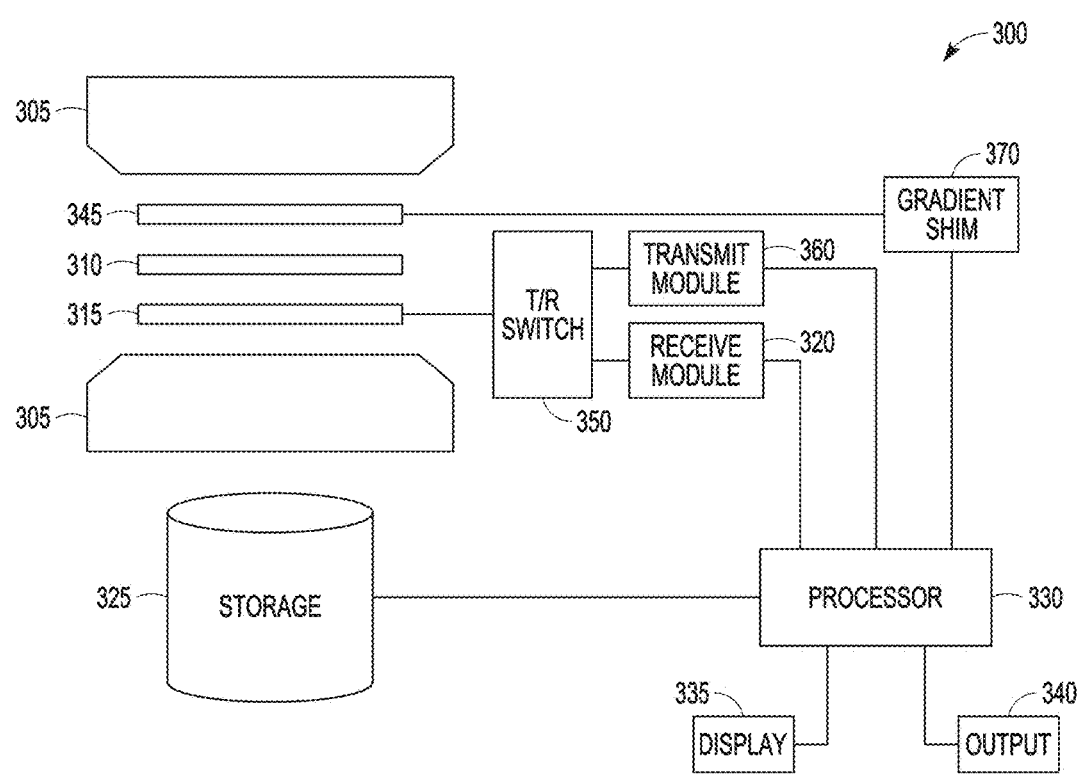
FIG. 13 illustrates a magnetic resonance system, according to one example.

FIG. 13 includes a block diagram of imaging system 300. Imaging system 300, in this example, depicts a magnetic resonance system and includes magnet 305. Object 310, coil 315, and gradient coil/shim 345 are positioned within the field of magnet 305. Object 310 can include a human body, an animal, a phantom, or other specimen. Coil 315, sometimes referred to as an antenna or array, can include a transmit coil or array, a receive coil or array, or a transmit/receive coil or array. Gradient/shim coil 345 is coupled to module 370. Module 370 provides control and power signals to coil 345 to apply a gradient and to apply a shim field.

As stated earlier, coil 315 can include a transmit coil or array, a receive coil or array, or a combined transmit and receive coil or array. As a transmit coil or array, coil 315, is coupled to transmit module 360, which includes the RF transmit front-end. In one example, the transmit module 360 and transmit coil 315, are configured to provide excitation to object 310. As a receive coil or array, coil 315 provides a signal to receive module 320. Receive module 320 can include an analog-to-digital converter (ADC), a pre-amplifier, a filter, or other module to prepare the received signal for processing. As a transmit/receive coil, coil 315 is coupled to both the transmit module 360 and receive module 320. T/R switch 350, provides isolation between the transmit module 360 and receive module 320.

Processor 330 is configured to execute an algorithm to control T/R switch 350, transmit module 360, receive module 320, and gradient shim module 370 in order to implement a method as described herein. Processor 330 can include a digital signal processor, an analog processor, a microprocessor, a controller, or other module to perform these operations. In the example shown, processor 330 is coupled to storage 325, display 335 and output module 340.

Storage 325 can include a memory for storing data. The data can include image data as well as results of processing performed by processor 330. In one example, storage 325 provides storage for executable instructions for use by processor 330. The instructions can be configured to implement a particular algorithm.

Display 335 can include a screen, a monitor, or other device to render a visible image corresponding to object 310. For example, display 335 can be configured to display a radial projection, a Cartesian coordinate projection, or other view corresponding to object 310. Output unit 340 can include a printer, a storage device, a network interface or other device configured to receive processed data.

Unlike Fourier dependent MR imaging where beam steering will excite regions outside the region of immediate interest, STEREO is exciting a highly localized and relatively small region, the majority of these additional unintended areas of constructive interference are beyond the STEREO excitation and are thus, not excited or encoded. The images that result from such a combination are generated based on constructive interference at the point of interest aligned with the region of excitation.

In one example, the algorithm includes a penalty function in the dynamic $B_1$ optimization that penalizes excitation in the parts of the image that will fall within the line perpendicular to the STEREO trajectory. This arrangement further reduces off-path excitation.

STEREO can also generate less SAR than other $B_1$ inhomogeneity mitigation approaches. For example, Transmit SENSE RF profiles are very complex because the entire imaging plane is manipulated in unison. STEREO, on the other hand, excites individual spatial points in succession which relaxes the RF constraints at any given moment and can result in an excitation that is more efficient versus transmit SENSE in terms of SAR.

With reduced wavelengths at the high field strengths, it may be challenging to generate homogeneous $B_1+$ over a large enough region of interest in the body for typical imaging methods. STEREO beam steering can benefit from these very inhomogeneous fields as they form a more complex basis set to be incorporated into the inverse problem solution, much like the benefits of high fields for parallel imaging, which is also inherently spatial and relies on inverse problem methods.

Figure 14:
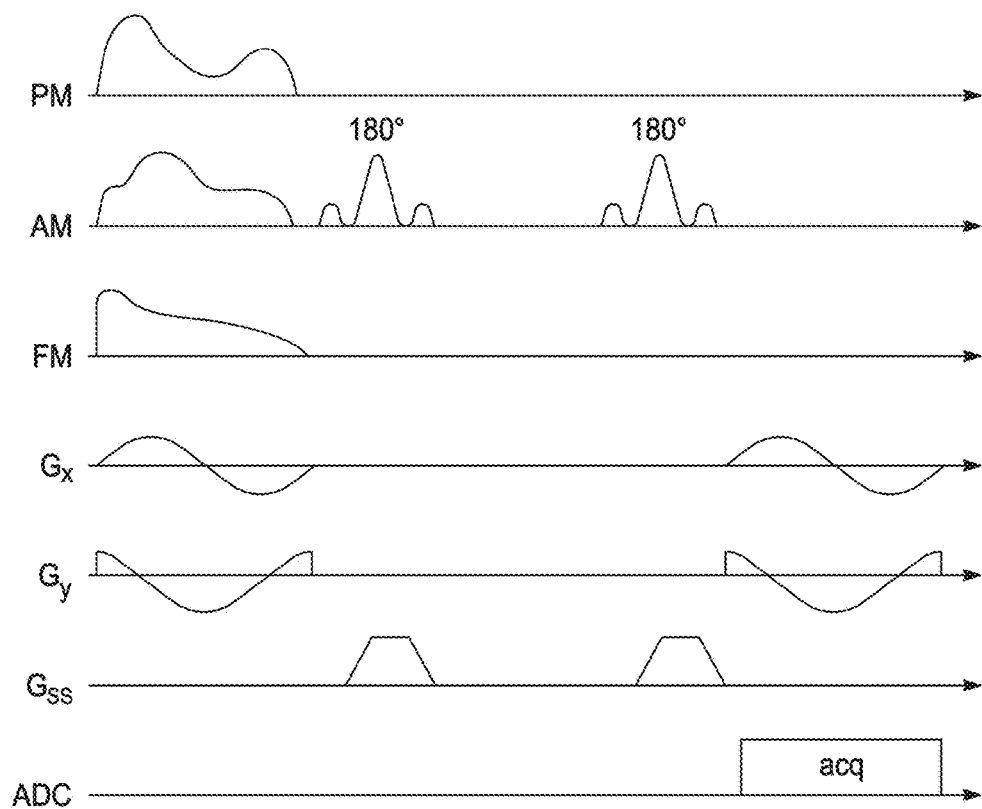
FIG. 14 illustrates a pulse sequence.

FIG. 14 illustrates a double echo STEREO pulse sequence. The pulse sequence shown can be used to generate an experimental image. An example of an image at 4 T and reconstructed with an inverse problem solution is shown in FIG. 10A. A comparable resolution GRE scout image is shown at FIG. 10B.

The double echo STEREO pulse sequence includes phase modulation (PM), amplitude modulation (AM), frequency modulation (FM), x-axis gradient ($G_x$), y-axis gradient ($G_y$), slice select gradient ($G_{ss}$), and acquisition (ADC).

FIGS. 15A-15F illustrate the results of a simulation showing two temporal/spatial points during excitation of a prostate at 7 T. In particular, FIG. 15A and FIG. 15B illustrate STEREO alone, FIG. 15C and FIG. 15D illustrate beam steering alone, and FIG. 15E and FIG. 15F illustrate STEREO with beam steering. The figures demonstrate improved spatial excitation localization due to the complementary nature of STEREO and beam steering.

Front-End and Coil

Figure 16:
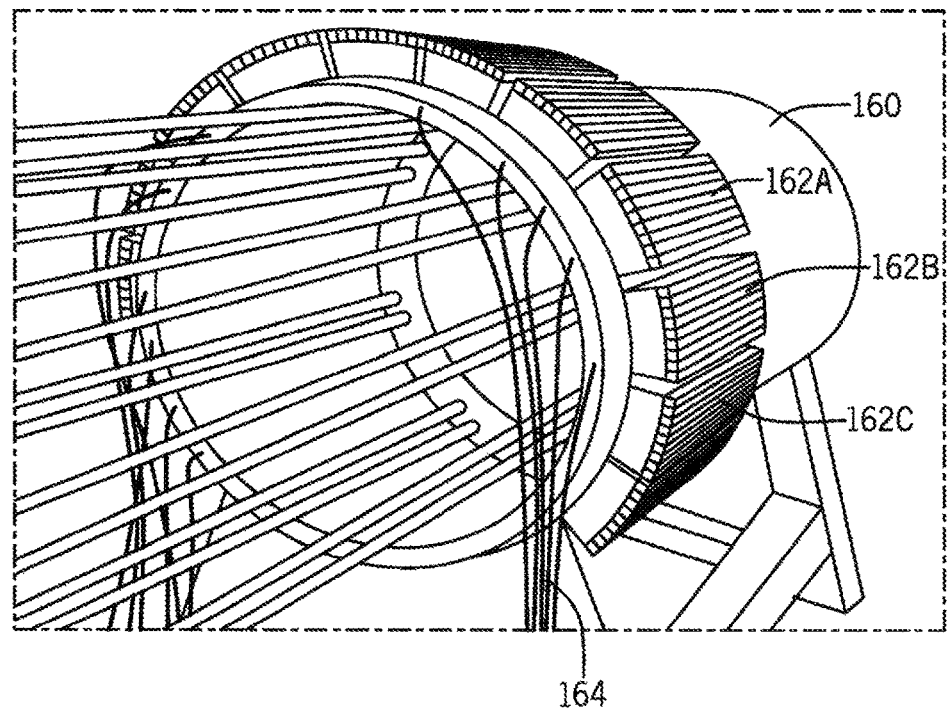
FIG. 16 illustrates a volume array having on-coil modules.

An example of a volume transmit array 160 is shown in FIG. 16. In a transmit array, each coil is individually tuned to the Larmor frequency of interest and matched to a known impedance. In one example, the array is configured for automatic tuning and matching using feedback from an RF signal and a PIN diode switched capacitance matrix. On-coil power amplifiers, transmit modules, transmit/receive (TR) switches, and preamplifiers are used in various examples. In the example shown, array 160 includes 16 elements, each of which is associated with an amplifier, such as amplifier 162A, 162B, and 162C. Each element is coupled to a processor, and in the figure, the elements are coupled by lines 164. The array can be a head array, a body array, or an extremity array.

The RF transmit front-end allows for simultaneous or interleaved multi-nuclear applications, swept frequency methods, and other frequency dependent protocols. In one example, a RF transmit front-end includes a transmitter module having a single chip modulator and a single Field Effect Transistor (FET) power amplifier. In one example, the power amplifiers are class E, nonlinear amplifiers that can be pre-compensated for linear output and are mounted directly on a coil element. The transmit module, in one example, is an integrated unit with a particular coil.

Figure 17:
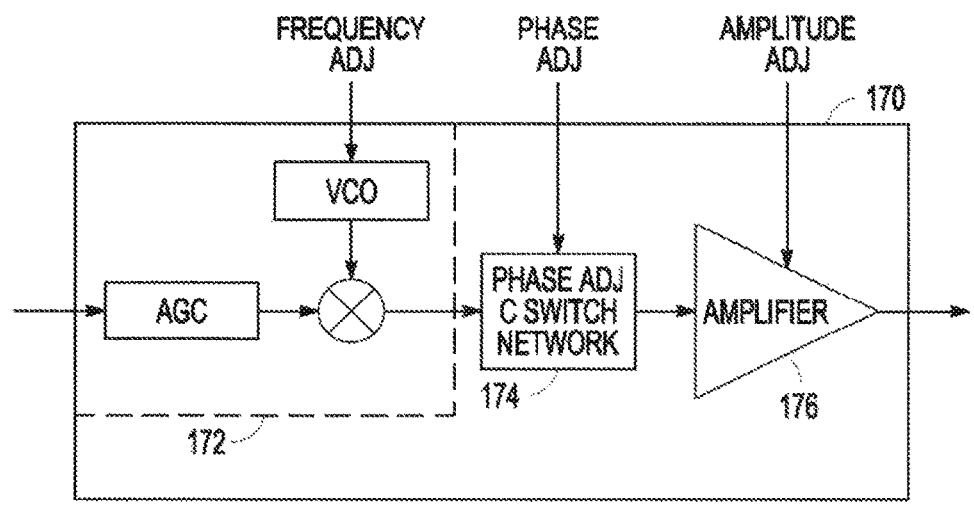
FIG. 17 illustrates a block diagram of a portion of a front-end module.

An example of front-end circuit 170 architecture is shown in block diagram form in FIG. 17. The block diagram in the figure shows frequency adjustment 172, phase adjustment 174, and amplitude adjustment 176 for one example channel.

The transmit signal is amplified to a specified output value through an automatic gain control (AGC) circuit to maintain predetermined operating conditions for the mixer. This signal can be mixed with a low frequency signal to adjust the input signal around the center frequency. The low frequency signal can be produced by a voltage-controlled oscillator (VCO) controlled through the frequency adjustment line. The output of the mixer is supplied to the phase adjustment circuitry. The phase of the signal is modified according to a phase control signal ranging from zero degrees to 360 degrees through capacitors that are switched into the system. The signal amplitude is adjusted by the system, taking into account the fixed input amplitude supplied via the AGC.

A sufficiently fast command cycle of the transmit module enables controlling phase and gain settings for interactive RF shimming. The command cycle time delay, in one example, is in the range of sub-microseconds and enables Transmit SENSE, automated shimming and other high-speed applications using on-the-fly waveform modulation and feedback control.

An example of the present subject matter allows imaging by moving a resonance region in a 2D or 3D spatial domain, acquiring data in a time dependent manner, and reconstructing an image without the use of a Fourier transform.

Data acquisition conducted entirely in the spatial domain, allows for treatment of problems that are spatial in nature, such as $B_1$ and $B_0$ inhomogeneity compensation.

Gradient shapes, as well as RF frequency and amplitude, can be modulated and tailored to compensate for field non-uniformities. This is useful for imaging using ultra-high fields as well as inhomogeneous, less expensive, portable magnets, and for imaging near metal implants.

An array of radiating elements can be operated in a manner to control the radiation pattern. For example, a direction of a lobe of the radiation pattern can be shifted in space and time in synchronous with a trajectory of a region of resonance in a magnetic resonance imaging system.

In beam steering, multiple phased antennas are modulated to generate an area of constructive interference. The beam can be modulated to move in a manner that follows a region of interest. The region of interest can include a region at resonance.

Figure 18:
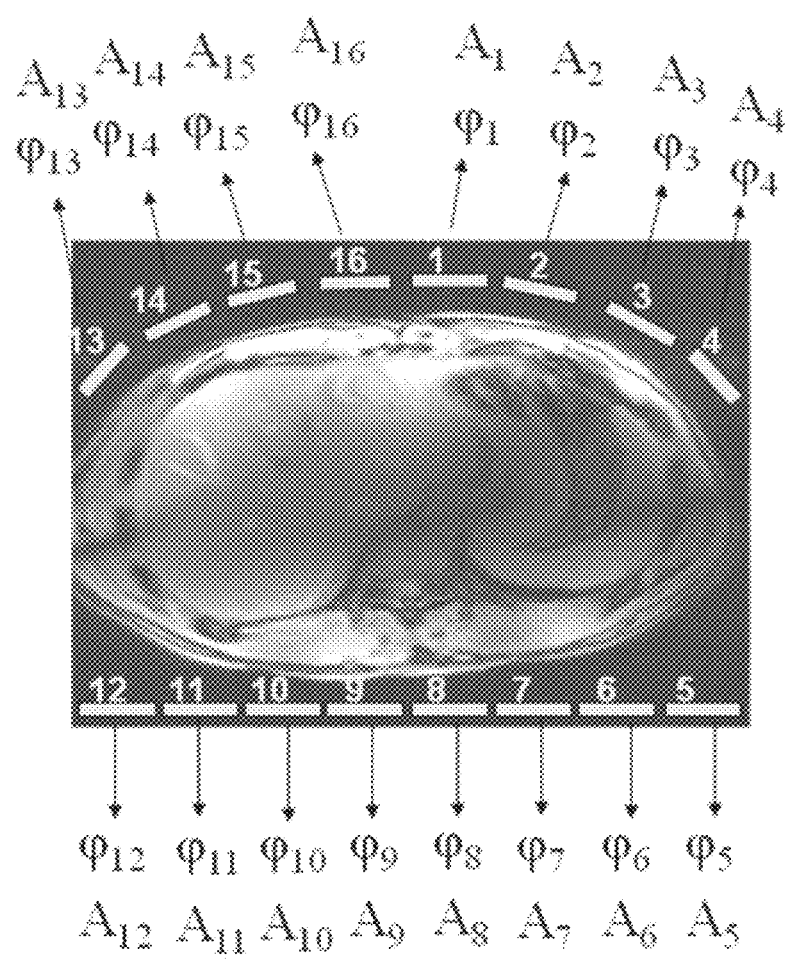
FIG. 18 illustrates an array of elements about a region of interest and corresponding amplitude and phase information.

FIG. 18 illustrates an array of coils distributed about a specimen. As shown in the figure, each element, here numbered 1 through 16, is individually controlled as to amplitude (A) and phase ($\phi$) in order to steer the radiation pattern. In one example, the radiation pattern (sometimes referred to as a beam) is steered to remain coincident with the trajectory of the resonance region within the specimen. The elements can be controlled in order to achieve a particular pattern associated with constructive interference or destructive interference.

FIG. 19A-19E illustrates localization of a region of interest by $B_1+$ shimming in terms of phase and magnitude. The illustrated images are generated with a magnetic field of 9.4 T. FIG. 19A illustrates five mask images and FIG. 19B illustrates five simulated images. FIG. 19C illustrates an example of a target region of interest. FIG. 19D illustrates an example of a predicted image. FIG. 19E illustrates an example of an acquired image.

FIGS. 20A, 20B, and 20C illustrate an example of images corresponding to beam steering. Region 202A and region 202B shown in FIG. 20A represent two points at which the region of resonance passes. FIGS. 20B and 20C depict selected images.

Method Example

FIG. 21 includes a flow chart of method 210 according to one example. Method 210 represents an example of generating an image by beam steering in conjunction with a spatiotemporal imaging sequence.

Method 210, according to one example includes, at 212, mapping the transmit and receive profiles for each RF channel. Method 210 also includes, at 214, generating phase and gain patterns to dynamically create constructive interference along a trajectory of a region of interest. The region of interest can be a point, a line, a plane, or other such region. Method 210 also includes, at 216, playing out, rendering, or implementing the individual phase and gain patterns on each channel to move the region of constructive interference in a manner corresponding to the trajectory. The trajectory of the region of interest can be modulated by controlling gradients and a frequency sweep to move the resonance region. In addition, method 210 can include, at 218, reconstructing the image by executing an inverse problem method, taking into account the trajectory, the RF profiles, and the phase and gain patterns.

A chirp pulse is but one example of a pulse suitable for use with the present subject matter. Other pulse forms, including a frequency-modulated pulse or a frequency swept pulse can also be used.

Parallel imaging entails using multiple receiver coils to accelerate data collection and reduce acquisition times. Various parallel reconstruction algorithms are available, including SENSE, SMASH, g-SMASH and GRAPPA. One or more regions of resonance can be selectively steered using various examples of the present subject matter. Multiple simultaneous regions of resonance can be employed without parallel imaging but may be particularly beneficial when used in combination with parallel imaging. Such implementations of parallel imaging with STEREO may prove beneficial for angiography, cardiac imaging, dynamic contrast enhancement, and other applications that benefit from high temporal resolution.

In one example, the STEREO technology described herein can be applied to parallel imaging. For example, the inverse problem can be addressed by controlling multiple steerable resonance regions using a multiband pulse. In addition, multiple receiver channels can be used to acquire image data.

In one example, multiple separate transmit channels are used. Each channel can be configured to present unique pulses or unique frequency offsets that produce discrete regions of resonance that can be steered as described herein. In one example, the magnitude of each channel is independently controlled or manipulated. The inverse problem approach, such as described in this document, can be used to generate an image.

The trajectory of the steerable resonance region can be in the form of a spiral. The trajectory can also include a series of concentric circles as well as a series of rotated and offset circles. In addition, the resonance region can be configured to remain in a stationary position in the form of an excitation point.

In one example, the trajectory can be described as a spiral. Image reconstruction can include calculating a pseudoinverse.

In one example, the present subject matter is configured to compensate for wide variations in magnetic field in a MR scanner system. A highly homogeneous magnet in a MR scanner system is very costly. An example of the present subject matter can be configured to generate good quality images using a low quality—and low cost—magnet system. The technology described herein can be applied to compensate for $B_0$ and $B_1$ variations.

Additional Notes

The following includes additional discussion of the inverse problem solution. The inverse problem can be solved using an analytical method or a simulation method (based on the Bloch equations).

Super Resolution

For some methods of spatiotemporal encoding, one dimension is slice selected, one dimension is acquired using phase encoding or frequency encoding (and is processed with a Fourier transform), and the time encoded dimension is generated by the linear relationship between time and space because of the frequency sweep. This can be called geometric reconstruction or assignment reconstruction. The parabolic phase profile generated by the frequency sweep will determine the pixel size in the image along the spatiotemporal encoding direction. The shape of this parabolic profile can be calculated based on known equations about phase. For each point in time, the phase profile across the time encoding dimension can be calculated. This can be simplified when the gradients are constant. The pixel size limitation arising from the phase profile can be removed, and thus a better resolution can be obtained in that dimension.

The Inverse Problem Solution and STEREO

One example of the present subject matter entails using an inverse problem reconstruction for MR data. Geometric reconstruction along the spatiotemporal encoding dimension is generally used in only one dimension. Super-resolution, as used with previous spatiotemporal encoding methods, entails processing to improve image resolution in one dimension and in order to form an image, the Fourier transform is used for at least one dimension.

For STEREO in 2D form, one dimension is slice selected and the remaining dimensions are spatiotemporally encoded. Using the geometric method employed for the 1D spatiotemporal method is inadequate, resulting in more complex problems than increased pixel size.

Expanding to two dimension of spatiotemporal encoding by introducing rotating gradients allows focusing of the signal both with a frequency sweep and with the rotational velocity. The profile along the radial dimension of the region of resonance is generated primarily by a frequency sweep. The tangential profile of the region of resonance is generated primarily by the gradient-induced rotational velocity. The combination of these contributions can determine the excitation profile, as demonstrated with simulations. However, a plot of the z-axis magnetization after excitation inherently hides the rotational contribution to the profile.

The rotational velocity contributes to the profile of the region of resonance. Geometric reconstruction is inadequate for use with more than one dimension of spatiotemporal encoding. Accordingly, one example of the present subject matter includes reconstruction of an MR image using only the inverse problem method.

Notes and Examples

An inhomogeneous $B_1$ magnetic field can be addressed by modulating the RF voltage while maintaining a constant gradient. Alternatively, an inhomogeneous $B_1$ magnetic field can be addressed by modifying the gradient-modulation function together with the frequency sweep function. An inhomogeneous $B_0$ magnetic field can be addressed by modulating a magnetic field using a $B_0$ coil ($B_0$ compensation coil) while the RF voltage is maintained at a constant. Alternatively, an inhomogeneous $B_0$ magnetic field can be addressed by modifying the frequency-sweep function while the RF voltage is maintained at a constant. Such methods can be used to enable good quality imaging using a low quality MR system.

In one example, the first magnetic field can be referred to as $B_0$ and thus, modulating the second magnetic field can include modulating $B_1$.

A variety of techniques can be used to generate both $B_0$ and $B_1$ magnetic fields. For example, various systems can be used to create simultaneous magnetic fields and modulations of those fields. In one example, the first magnetic field can be the main magnetic field and one or more shim coils can generate a modulated magnetic field, in which case the first and second magnetic fields can both be considered $B_0$.

Each of these non-limiting examples can stand on its own, or can be combined in any permutation or combination with any one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for producing an image with a magnetic resonance imaging (MRI) system comprising: acquiring data from a subject by controlling the MRI system to:
generate one or more magnetic field gradients to define a resonance region in which spin isochromats are resonant at a resonance frequency, and wherein the one or more magnetic field gradients cause the resonance region to move in space along a trajectory;
generate a radio frequency (RF) field that is resonant with the resonance frequency by generating and dynamically adjusting at least one parameter of a plurality of independently adjustable RF pulses to steer a focal region of the RF field along the trajectory to be coincident with the resonance region;
acquire data from spin isochromats in the resonance region in response to applying the focal region of the RF field to the resonance region; and
reconstructing an image of the subject from the acquired data.

2. The method as recited in claim 1, wherein the at least one parameter is selected from the group consisting of gain, phase, frequency, space, and time.

3. The method as recited in claim 1, wherein the RF field comprises a frequency-swept pulse.

4. The method as recited in claim 3, wherein the MRI system also generates magnetic field gradients during the frequency-swept pulse.

5. The method as recited in claim 1, wherein the RF field comprises a gapped RF excitation.

6. The method as recited in claim 1, wherein applying the magnetic field gradients includes increasing magnetic field inhomogeneities at a location different from the resonance region.

7. The method as recited in claim 1, wherein the trajectory is at least one of a spiral trajectory, a circular trajectory, or a point trajectory.

8. The method as recited in claim 7, wherein the trajectory comprises a plurality of circular trajectories that includes at least one of a series of concentric circles or a series of rotated and offset circles.

9. A radio frequency (RF) assembly for use in magnetic resonance, comprising:
an RF coil array having a plurality of RF coil elements for generating an RF field, wherein each RF coil element is independent of another RF coil element, each RF coil element having an input port;
an RF transmitter having a plurality of transmit channels wherein each transmit channel is coupled to an input port of one of the plurality of RF coil elements in the RF coil array, each transmit channel having at least one dynamically adjustable parameter to steer a focal region of the RF field through space along a trajectory;
a processor coupled to a magnetic resonance imaging (MRI) system and to the RF transmitter, the processor being configured to:
control the MRI system generate one or more magnetic field gradients in order to define a resonance region in which spin isochromats are resonant at a resonance frequency, and wherein the one or more magnetic field gradients cause the resonance region to move in space along a trajectory
control the RF transmitter to dynamically adjust the at least one dynamically adjustable parameter for each one of the plurality of RF coil elements in order to steer a focal region of the RF field along the trajectory to be coincident with the resonance region.

10. The RF assembly as recited in claim 9, wherein each RF coil element is electrically independent of each other RF coil element in the RF coil array.

11. The RF assembly as recited in claim 9, wherein each RF coil element in the RF coil array is supplied by an electrically independent control line.

12. The RF assembly as recited in claim 9, wherein at least one of the RF coil elements in the RF coil array is electrically decoupled from another one of the plurality of RF coil elements in the RF coil array.

13. The RF assembly as recited in claim 9, wherein the at least one parameter is selected from the group consisting of gain, phase, frequency, space, and time.

14. The RF assembly as recited in claim 13, wherein the processor is configured to coordinate at least two of gain, phase, frequency, space, and time in moving the resonance region.

* * * * *

UNITED STATES PATENT AND TRADEMARK OFFICE
CERTIFICATE OF CORRECTION

PATENT NO. : 9,903,928 B2
APPLICATION NO. : 14/174368
DATED : February 27, 2018
INVENTOR(S) : Angela Lynn Styczynski Snyder et al.

Page 1 of 1

It is certified that error appears in the above-identified patent and that said Letters Patent is hereby corrected as shown below:

In the Specification

Column 7, Line 62, "$M_t$" should be --$M_z$--.

Column 8, Line 58, "processing" should be --precessing--.

Column 13, Line 23, "$b_{w,excitation}$" should be --bw,$_{excitation}$--.

Column 13, Line 24, "$b_{w,acquisition}$" should be --bw,$_{acquisition}$--.

Column 13, Line 58, "$b_{w,excitation}$" should be --bw,$_{excitation}$--.

Column 13, Line 58, "$b_{w,acquisition}$" should be --bw,$_{acquisition}$--.

Signed and Sealed this
Twenty-second Day of January, 2019

Andrei Iancu
*Director of the United States Patent and Trademark Office*